United States Patent
Wang

(10) Patent No.: US 11,515,492 B2
(45) Date of Patent: Nov. 29, 2022

(54) COMPOUND, DISPLAY PANEL, AND DISPLAY APPARATUS

(71) Applicant: WuHan TianMa Micro-electronics CO., LTD., Wuhan (CN)

(72) Inventor: Kui Wang, Wuhan (CN)

(73) Assignee: WuHan TianMa Micro-electronics CO., LTD., Wuhan (CN)

( * ) Notice: Subject to any disclaimer, the term of this patent is extended or adjusted under 35 U.S.C. 154(b) by 387 days.

(21) Appl. No.: 16/820,558

(22) Filed: Mar. 16, 2020

(65) Prior Publication Data

US 2021/0202850 A1    Jul. 1, 2021

(30) Foreign Application Priority Data

Dec. 31, 2019   (CN) .......................... 201911411144.5

(51) Int. Cl.

| | | |
|---|---|---|
| H01L 51/00 | (2006.01) | |
| C07F 9/64 | (2006.01) | |
| C09K 11/06 | (2006.01) | |
| C07F 9/6568 | (2006.01) | |
| C07F 9/6596 | (2006.01) | |
| H01L 51/50 | (2006.01) | |

(52) U.S. Cl.
CPC .......... *H01L 51/008* (2013.01); *C07F 9/6596* (2013.01); *C07F 9/65685* (2013.01); *C09K 11/06* (2013.01); *H01L 51/0059* (2013.01); *H01L 51/0061* (2013.01); *H01L 51/0072* (2013.01); *H01L 51/0073* (2013.01); *C09K 2211/1018* (2013.01); *H01L 51/0067* (2013.01); *H01L 51/0071* (2013.01); *H01L 51/5012* (2013.01)

(58) Field of Classification Search
CPC .... C09K 11/06; C07F 9/6596; C07F 9/65685; H01L 51/008
See application file for complete search history.

(56) References Cited

U.S. PATENT DOCUMENTS

2020/0185626 A1* 6/2020 Yuuki .................. C07F 9/6584

FOREIGN PATENT DOCUMENTS

CN           105431439 A        3/2016

* cited by examiner

*Primary Examiner* — Shawquia Jackson
(74) *Attorney, Agent, or Firm* — Christensen O'Connor Johnson Kindness PLLC

(57) ABSTRACT

The present disclosure provides a boron-heterocyclic compound having a structure represented by Chemical Formula 1, in which $L_1$ and $L_2$ are each independently selected from a single bond, C6-C30 aryl, C6-C30 fused aryl, C4-C30 heteroaryl, or C4-C30 fused heteroaryl; and $R_1$ and $R_2$ are each independently selected from carbazolyl and derivative groups thereof, acridinyl and derivative groups thereof, and diarylamino and derivative groups thereof. In an embodiment, the boron-heterocyclic structure is suitable for use not only as an electron acceptor group but also as a linking group. By linking a group having a large steric hindrance to the boron atom of the boron-heterocyclic ring, the compound molecules are prevented or limited from aggregating, and thus a π-aggregation or excimer formed by direct accumulation of conjugate planes is avoided or reduced, thereby improving luminous efficiency. The present disclosure further provides a display panel and a display apparatus containing the compound.

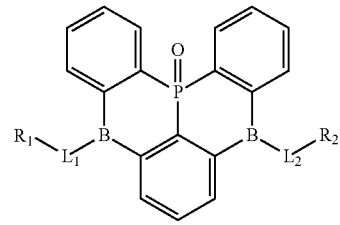

Chemical Formula 1

20 Claims, 3 Drawing Sheets

COMPOUND, DISPLAY PANEL, AND DISPLAY APPARATUS

CROSS-REFERENCE TO RELATED APPLICATIONS

The present application claims priority to Chinese Patent Application No. 201911411144.5, filed on Dec. 31, 2019, the content of which is incorporated herein by reference in its entirety.

TECHNICAL FIELD

The present disclosure relates to the technical field of organic electroluminescent materials, and particularly, to a compound, and a display panel and a display apparatus containing the compound.

BACKGROUND

With the rapid development of electronic display technology, Organic Light-emitting Diodes (OLEDs) are widely used in various display devices. Particularly, research and applications of luminescent materials of OLEDs are also increasing in recent years due to the growing demand for OLEDs in smartphone industry.

Based on the luminescence mechanisms, materials applied in a light-emitting layer of the OLED mainly include four types:

(1) fluorescent materials; (2) phosphorescent materials; (3) triplet-triplet annihilation (TTA) materials; and (4) thermally activated delayed fluorescence (TADF) materials.

Regarding the TADF materials, when an energy level difference between a singlet excited state and a triplet excited state is small, a reverse intersystem crossing (RISC) may occur in the molecules, and the excitons are converted from a T1 state to an S1 state by absorbing ambient heat, so that 75% of triplet excitons and 25% of singlet excitons can be utilized at the same time. In this way, the theoretical maximum internal quantum yield can reach 100%. The TADF materials are mainly organic compounds without rare metal elements, so that the production cost of such materials is relatively low. The TADF materials can be chemically modified by various methods. TADF materials have many advantages over traditional OLED luminescent materials. However, there are few TADF materials that have been discovered so far. Accordingly, there is a pressing need to develop new TADF materials applicable in OLED devices.

SUMMARY

In view of the problems to be solved in the related art, a purpose of the present disclosure is to provide a boron-heterocyclic compound having a structure according to Chemical Formula 1:

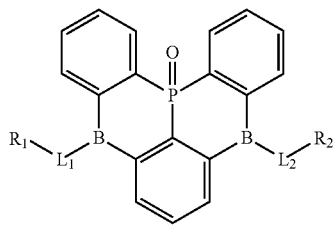

Chemical Formula 1 wherein $L_1$ and $L_2$ are each independently selected from the group consisting of a single bond, C6-C30 aryl, C6-C30 fused aryl, C4-C30 heteroaryl, and C4-C30 fused heteroaryl;

$R_1$ and $R_2$ are each independently selected from the group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and derivative groups thereof, acridinyl and derivative groups thereof, and diphenylamino and derivative groups thereof.

In the present disclosure, without wishing to be bound by theory, it is believed that the boron-heterocyclic structure functions as both an electron acceptor group and a linking group. In the compound of the present disclosure, by linking a group having a large steric hindrance to the boron atom of the boron-heterocyclic compound, it is believed that effective intramolecular charge transfer is enhanced, while aggregation of the compound molecules is avoided or reduced. In this regard, the compounds of the present disclosure also, thereby avoid or reduce formation of a π-aggregation or excimer by directly overlapping conjugate planes, thereby improving the luminous efficiency.

Since the compound of the present disclosure has TADF property, triplet excitons formed therein, which are blocked in molecular transition of the conventional fluorescent material, can be used to emit light, thereby improving the efficiency of device. Without wishing to be bound by theory, it is believed that the compounds of the present disclosure are rigid distortions of a great degree, which reduces the overlap between HOMO and LUMO levels. Thus, the energy level difference between the triplet state and the singlet state can be reduced to 0.25 eV to satisfy the requirement of the reverse intersystem crossing from the triplet state to the singlet state. Therefore, the luminous efficiency is improved.

The boron-heterocyclic compound itself, as the TADF material, is generally bipolar, and thus can greatly improve the transport ability of two kinds of carriers and improve the balance of the carriers when it is used as the material of the light-emitting layer. In this regard, the compounds of the present disclosure are suitable to improve the fluorescence quantum efficiency and reduce the device voltage compared to conventional materials.

The present disclosure further provides a display panel and a display apparatus including the boron-heterocyclic compound according to the present disclosure.

DESCRIPTION OF EMBODIMENTS

Figure 1:
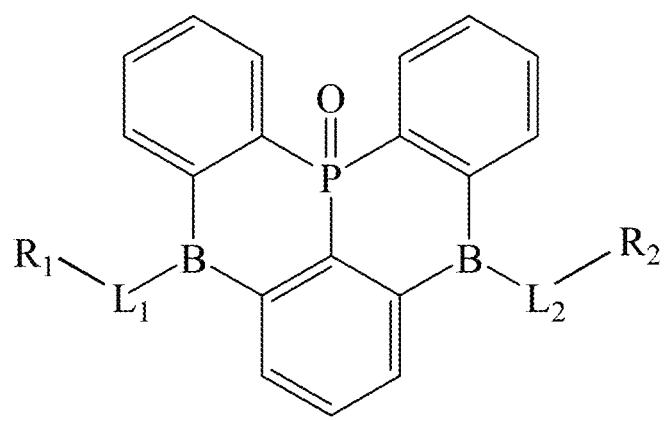
FIG. 1 is a chemical formula of a boron-heterocyclic compound according an embodiment of to the present disclosure.

The present disclosure is further described through examples and comparative examples. These embodiments are only used to illustrate the present disclosure, but the present disclosure is not limited thereto. Without departing from the scope of the present disclosure, any modification or equivalent replacement with respect to the technical solutions of the present disclosure shall fall into the protection scope of the present disclosure.

In a first aspect, the present disclosure provides a boron heteropyrene compound having a structure according to Chemical Formula (1):

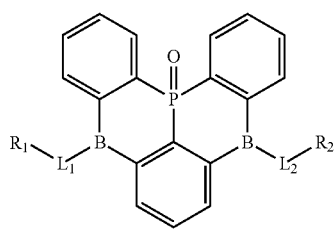

Chemical Formula (1)

wherein $L_1$ and $L_2$ are each independently selected from the group consisting of a single bond, C6-C30 aryl, C6-C30 fused aryl, C4-C30 heteroaryl, and C4-C30 fused heteroaryl;

$R_1$ and $R_2$ are each independently selected from a group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl and derivative groups thereof, acridinyl and derivative groups thereof, and diphenylamino and derivative groups thereof.

In the present disclosure, without wishing to be bound by theory, it is believed that the boron-heterocyclic compound functions as both an electron acceptor group and a linking group. In addition, in an embodiment of the boron-heterocyclic compound of the present disclosure, a center skeleton of the compound molecule has a phosphoroso group, in which phosphorus atom is bonded in a tetrahedral configuration. In this regard, the compound has strong out-of-ring electron delocalization. The presence of phosphorus-oxygen bonds (P=O) increases a degree of systematic conjugation, leading to a red shift of an emission spectrum of the compound. Further, due to the tetrahedral configuration, the steric hindrance effect is great enough to prevent or limit an aggregation of solid-state molecules, thereby improving the quantum efficiency of the compound.

According to an embodiment of the compound of the present disclosure, $L_1$ and $L_2$ are each independently selected from the group consisting of phenylene, naphthylene, anthrylene, phenanthrylene, pyridylidene, furylidene, pyrimidinylidene, benzofurylidene, thienylene, benzothienylene, pyrrolylene, indolylidene, carbazolylene, oxazolylene, benzoxazolylene, thiazolylene, benzothiazolylene, imidazolylene, benzimidazolylene, indazolylene, quinolinylene, and isoquinolinylene.

According to an embodiment of the compound of the present disclosure, $L_1$ and $L_2$ are identical. Synthesis of the compound is much easier when $L_1$ and $L_2$ are identical; likewise, an electron cloud of the compound can be better separated when $L_1$ and $L_2$ are identical.

According to an embodiment of the compound of the present disclosure, $R_1$ and $R_2$ are identical. When $R_1$ and $R_2$ are identical, the synthesis of the compound is easier, and a higher purity can be obtained after purification, which is favorable for industrialization; likewise, a symmetric structure increases the probability of molecules stacking during film formation, thereby increasing charge mobility within the compound.

According to an embodiment of the compound of the present disclosure, $R_1$ and $R_2$ are each independently selected from the following formulas:

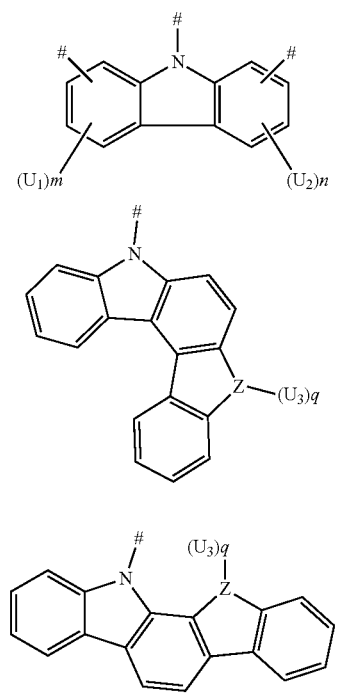

-continued

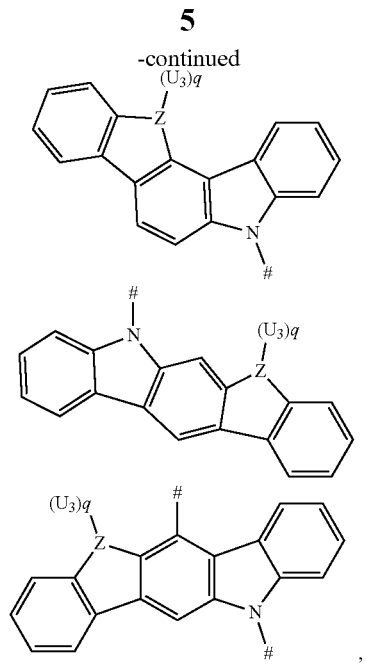

wherein

Z is selected from the group consisting of a carbon atom, a nitrogen atom, an oxygen atom, and a sulfur atom;

$U_1$, $U_2$ and $U_3$ are each independently selected from the group consisting of a hydrogen atom, C1-C6 alkyl, and C1-C6 alkoxy;

m, n and q are each independently an integer selected from 0, 1 and 2;

when Z is an oxygen atom or a sulfur atom, q is 0; and # represents a bonding position.

According to an embodiment of the compound of the present disclosure, $R_1$ and $R_2$ are each independently selected from the following groups:

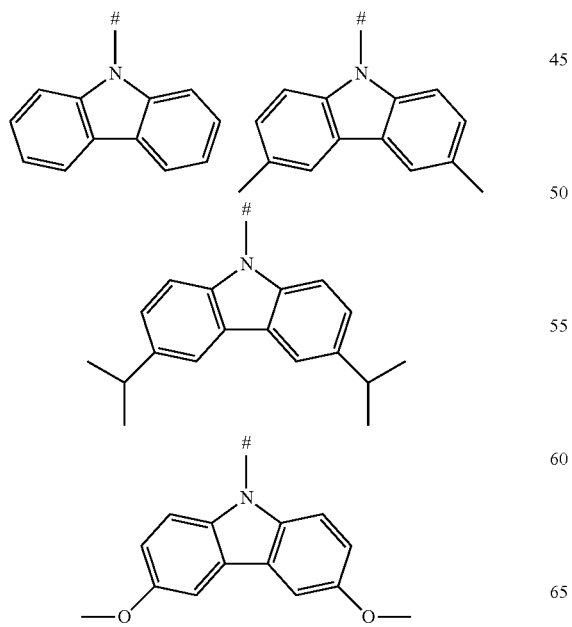

-continued

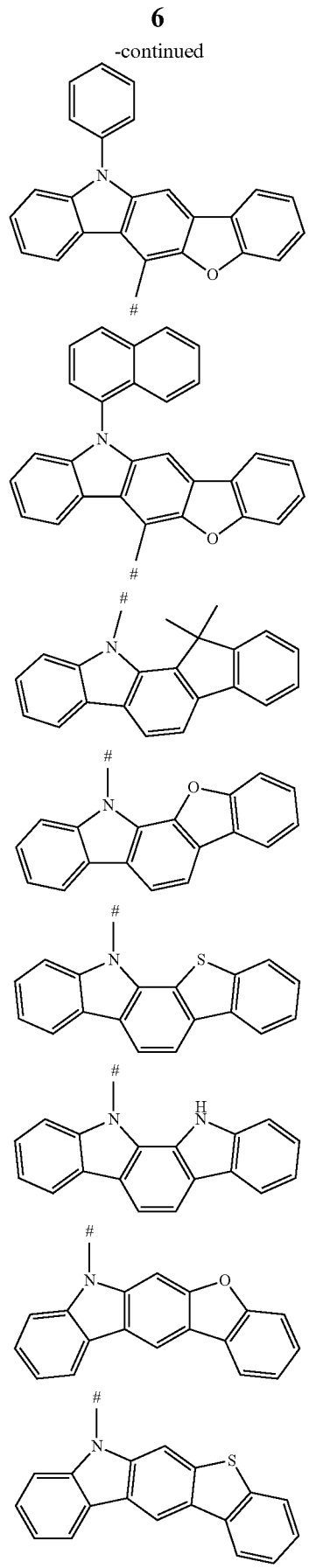

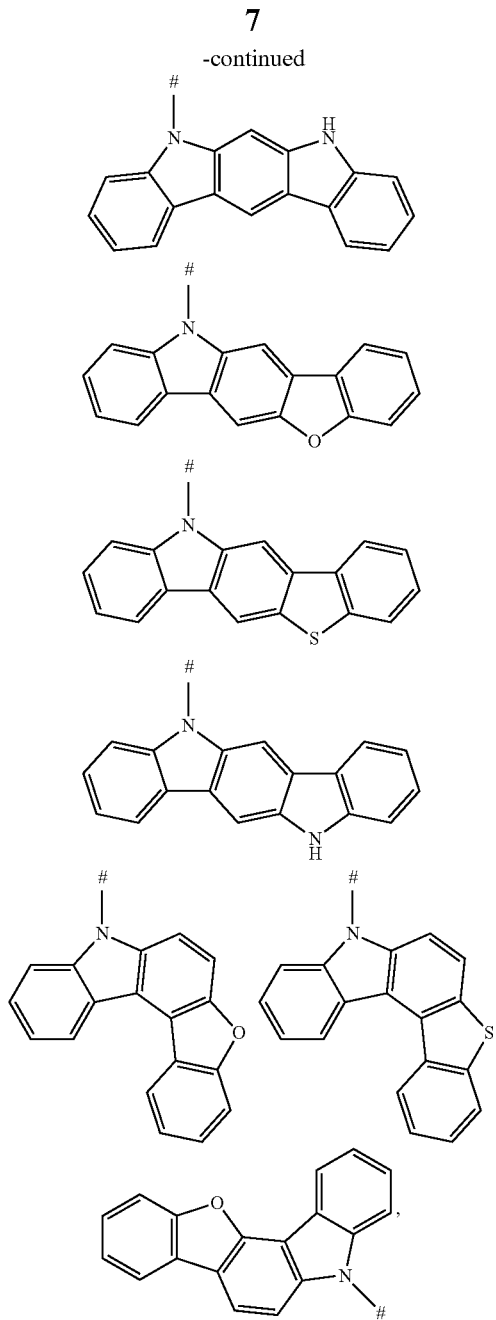

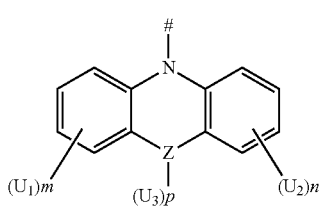

wherein # represents a bonding position.

Carbazolyl is a relatively weak electron-donating group, which can effectively avoid or reduce the red shift effect of the molecular spectrum by the distorted molecular structure.

According to an embodiment of the compound of the present disclosure, $R_1$ and $R_2$ are each independently selected from the following formulas:

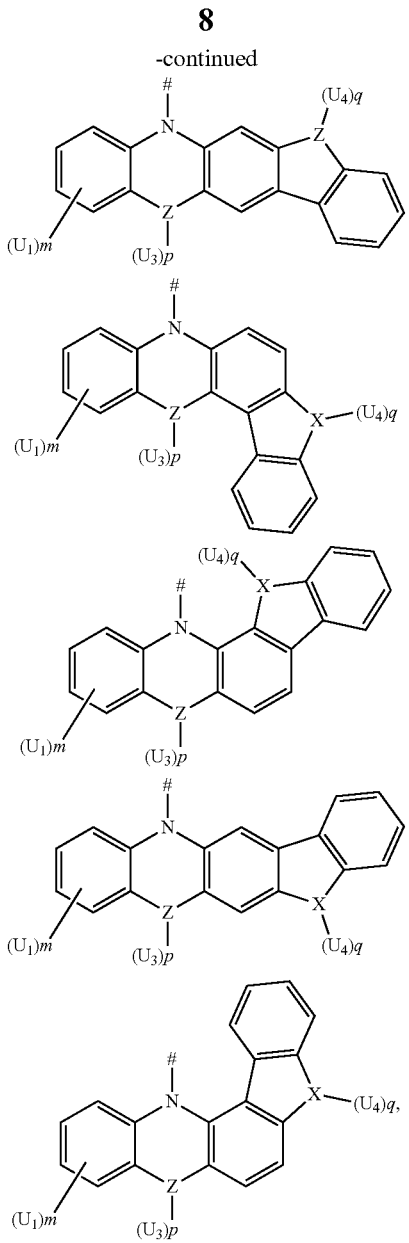

wherein

Z is selected from the group consisting of a carbon atom, a nitrogen atom, an oxygen atom, a sulfur atom, and a silicon atom;

X is selected from the group consisting of a carbon atom, a nitrogen atom, an oxygen atom, and a sulfur atom;

$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl;

m, n, p and q are each an integer independently selected from 0, 1 and 2;

when Z is an oxygen atom or a sulfur atom, p is 0, and when X is an oxygen atom or a sulfur atom, q is 0; and # represents a bonding position.

According to an embodiment of the compound of the present disclosure, $R_1$ and $R_2$ are each independently selected from the following formulas:

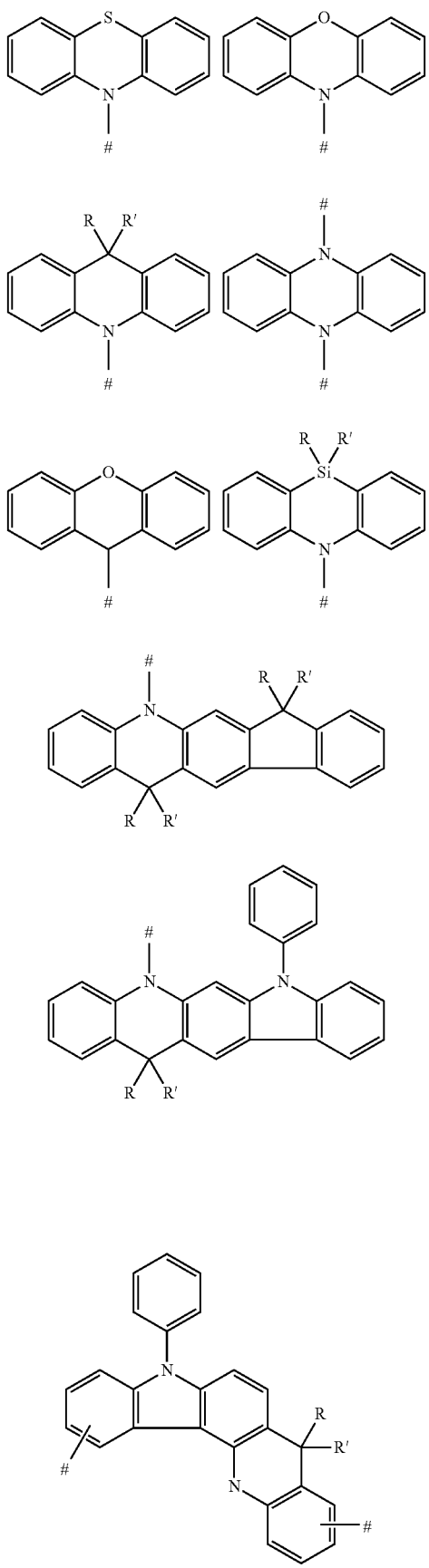

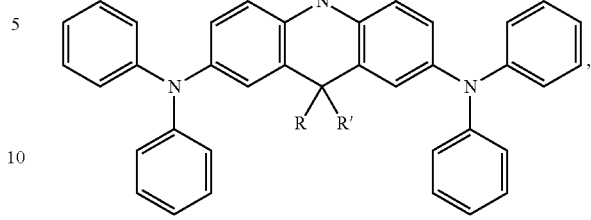

wherein
R and R' are each independently selected from the group consisting of a hydrogen atom, C1-C3 alkyl, and phenyl; and
# represents a bonding position.

Acridinyl groups (such as phenothiazinyl, phenoxazinyl, etc.) generally have good morphological stability, and thus are beneficial to formation of an amorphous state in the films formed from compounds having such groups, thereby improving the stability of the organic film layer.

According to an embodiment of the compound of the present disclosure, $R_1$ and $R_2$ are each independently selected from the following formulas:

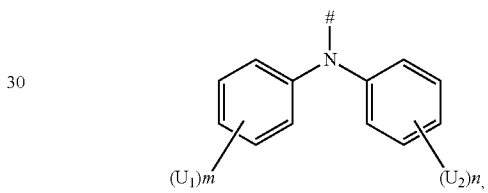

wherein
$U_1$ and $U_2$ are each independently selected from the group consisting of a hydrogen atom, C1-C6 alkyl, and C1-C6 alkoxy;
m and n are each an integer independently selected from 0, 1, and 2; and
# represents a bonding position.

According to an embodiment of the compound of the present disclosure, $R_1$ and $R_2$ are each independently selected from the following groups:

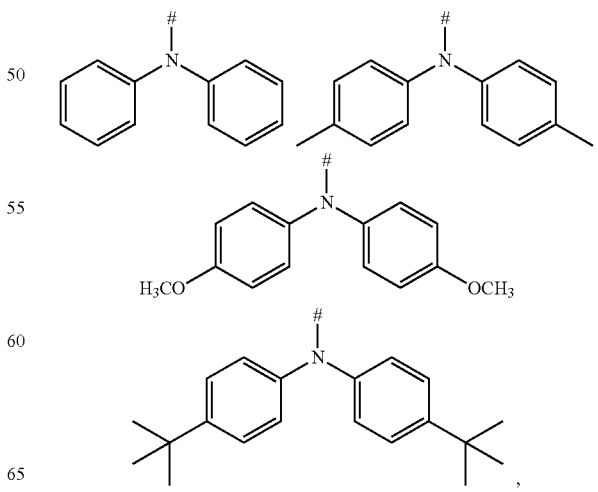

wherein # represents a bonding position.

Phenylamino groups are another type of carbazolyl having weak rigidity and having good thermal stability and hole transport performance. When introduced into a molecule, such groups can effectively balance charge transport performance.

According to an embodiment of the compound of the present disclosure, $R_1$ and $R_2$ are each independently selected from the following formulas:

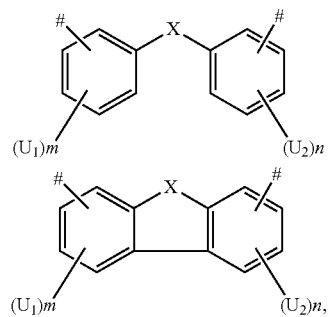

wherein

X is an oxygen atom or a sulfur atom;

$U_1$ and $U_2$ are each independently selected from the group consisting of a hydrogen atom, C1-C6 alkyl, C3-C6 cycloalkyl, and C1-C6 alkoxy;

m and n are each an integer independently selected from 0, 1, and 2; and # represents a bonding position.

According to an embodiment of the compound of the present disclosure, $R_1$ and $R_2$ are each independently selected from the following groups:

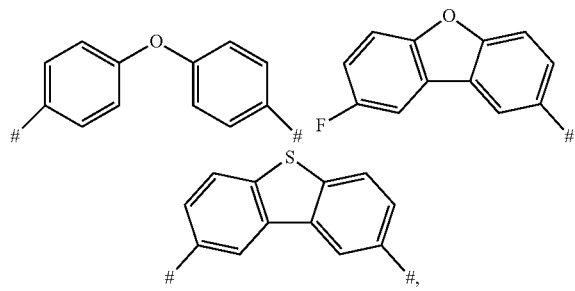

wherein # represents a bonding position.

A diphenyl ether group has similar properties as phenylamino, i.e., it is a carbazolyl group with weak rigidity, and has good thermal stability and hole transport performance. When introduced into a molecule, it is believed that it can effectively balance charge transport performance. Dibenzothienyl and dibenzofuryl are relatively weak electron-donating groups. Conjugation systems of compounds including such groups generally have a strong out-of-ring conjugation and can have a strong interaction with a center skeleton so as to improve molecular stability.

According to an embodiment of the compound of the present disclosure, $L_1$ and $L_2$ are each independently selected from the following groups:

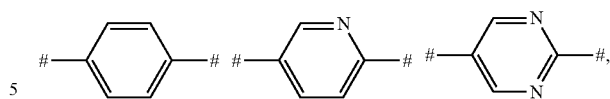

$R_1$ and $R_2$ are each independently selected from the following formulas:

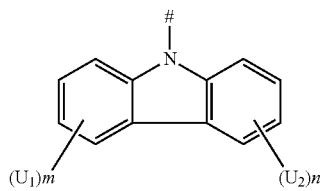

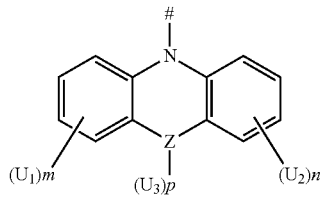

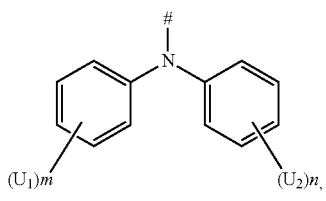

wherein $U_1$, $U_2$, and $U_3$ are each independently selected from the group consisting of C1-C3 alkyl, and C6-C12 aryl;

m and n are 0, and p is selected from 0, 1, and 2;

Z is selected from the group consisting of a carbon atom, a nitrogen atom, an oxygen atom, and a sulfur atom;

when Z is an oxygen atom or a sulfur atom, p is 0; and # represents a bonding position.

According to an embodiment of the compound of the present disclosure, $L_1$ and $L_2$ are each independently selected from the following groups:

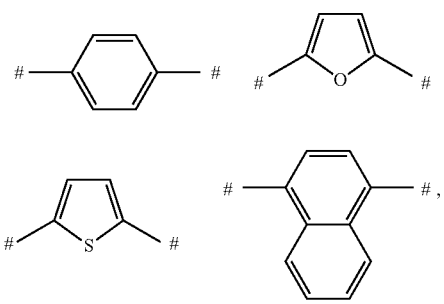

R₁ and R₂ are each independently selected from the following groups:

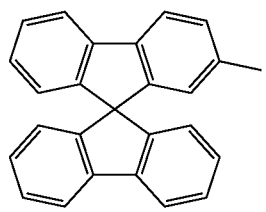 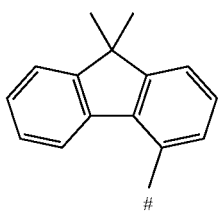

wherein # represents a bonding position.

With the combination of these groups in the above embodiments, on the one hand, a relatively distorted spatial structure can be formed, and thus HOMO and LUMO energy levels are separated to a greater extent, and an energy level difference, $\Delta E_{ST}$, between a lowest singlet energy level, S1, of the compound and a lowest triplet energy level, T1, of the compound is smaller. On the other hand, the combination of these groups will not completely separate HOMO and LUMO, and, thus, will not cause poor charge transmission performance.

According to an embodiment of the compound of the present disclosure, the compound is selected from any one of the following compounds:

M1

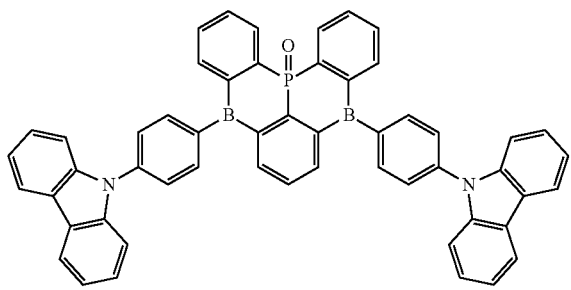

M2

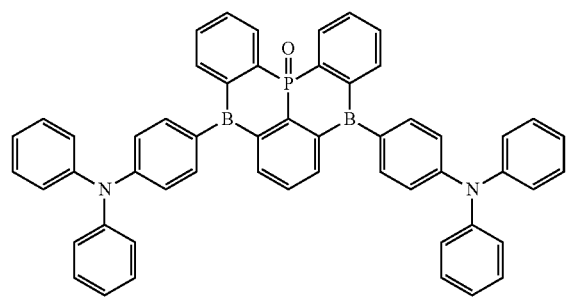

M3

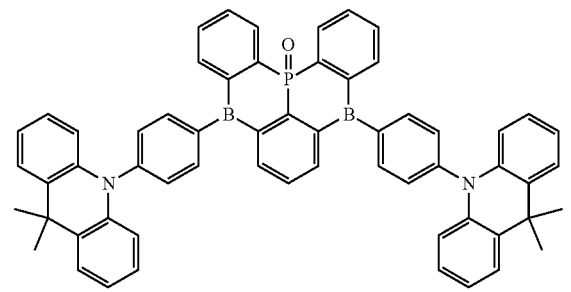

-continued

M4

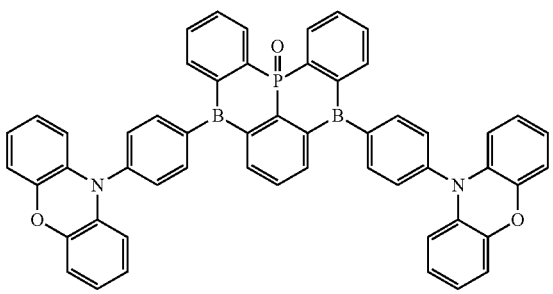

M5

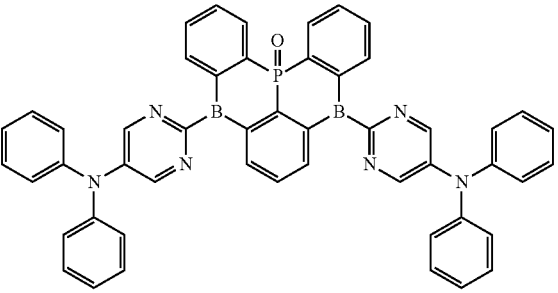

M6

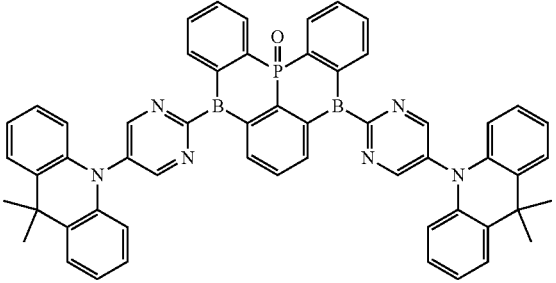

M7

M8

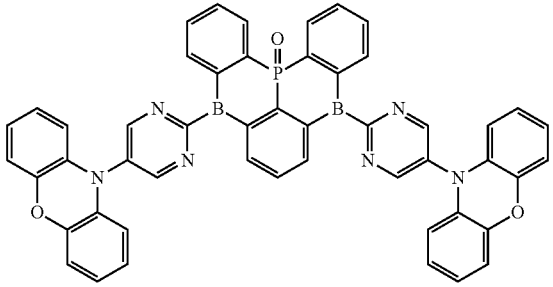

-continued
M9
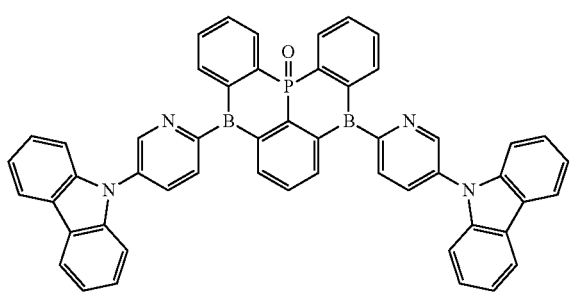
M10
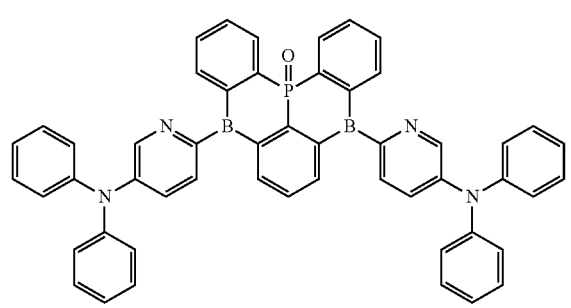
M11
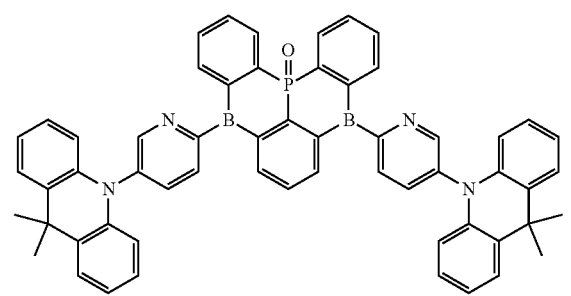
M12
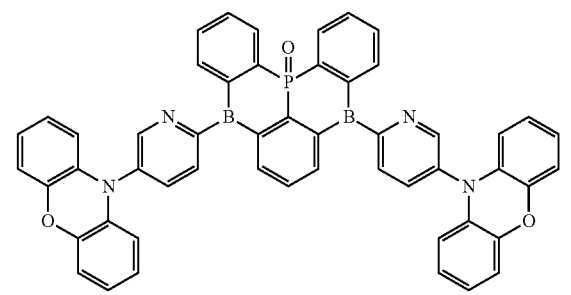
M13
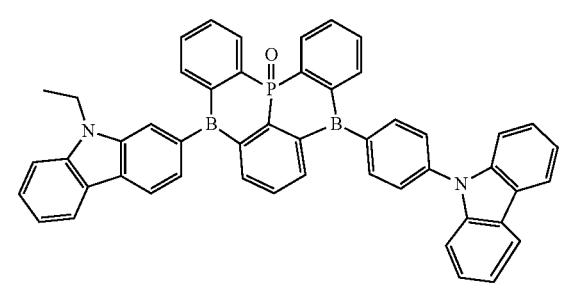
-continued
M14
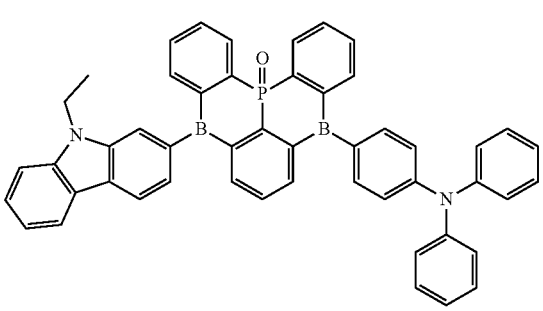
M15
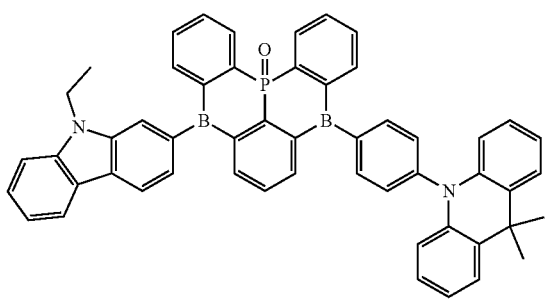
M16
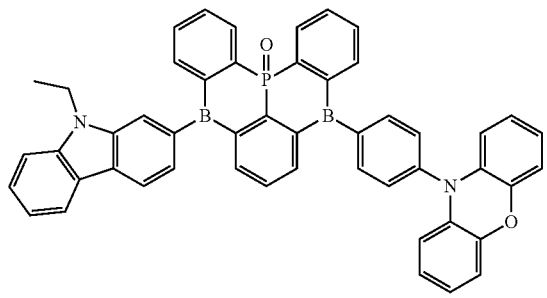
M17
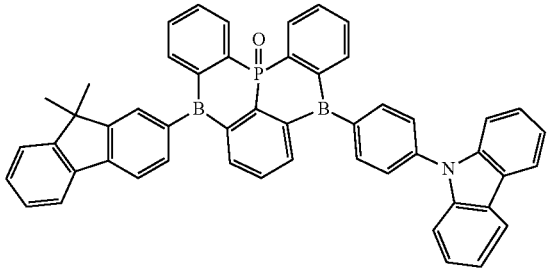
M18

M19
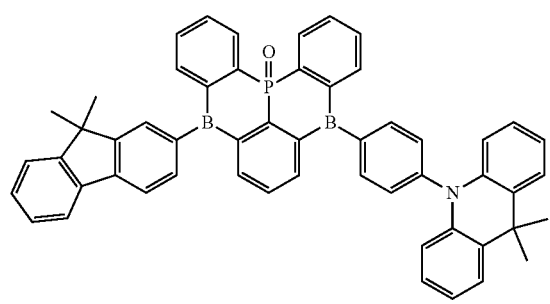
M20
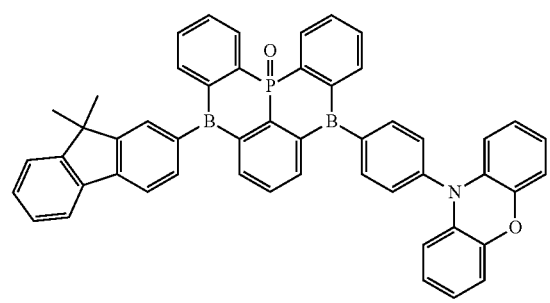
M21
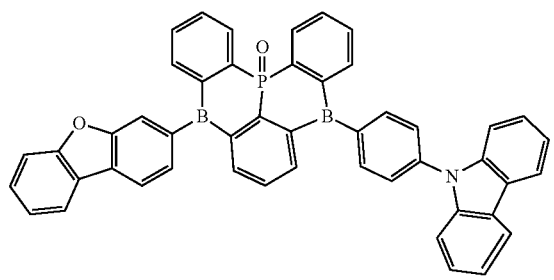
M22
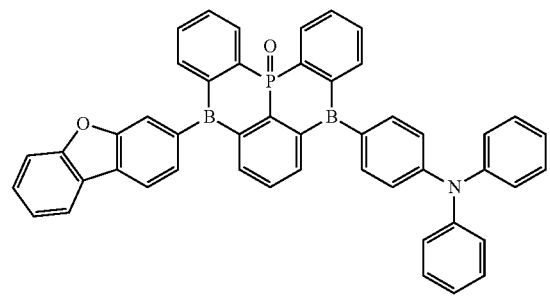
M23
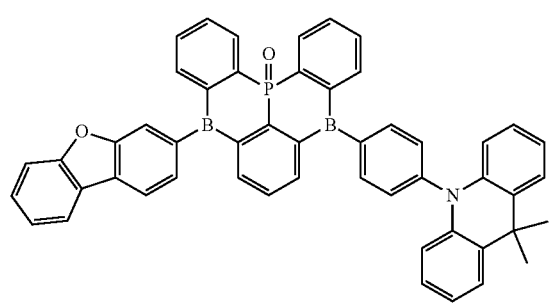
M24
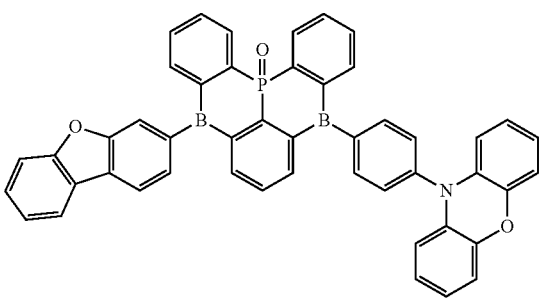
M25
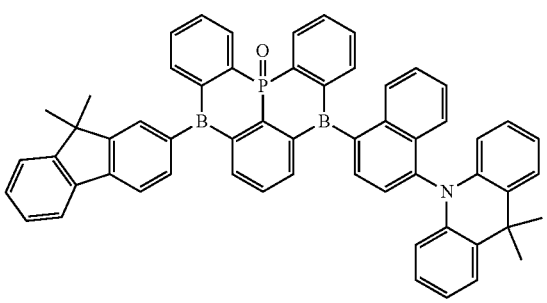
M26
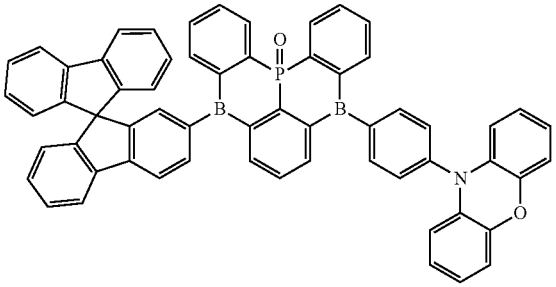
M27
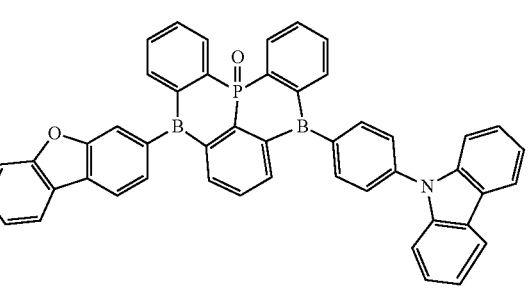
M28
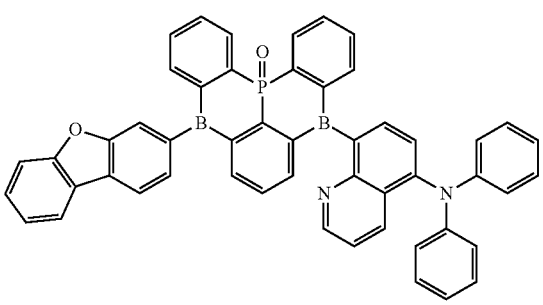

M29

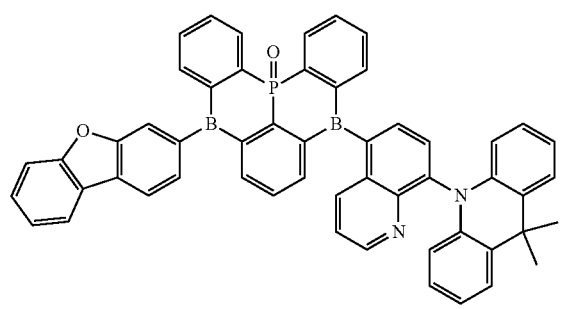

M30

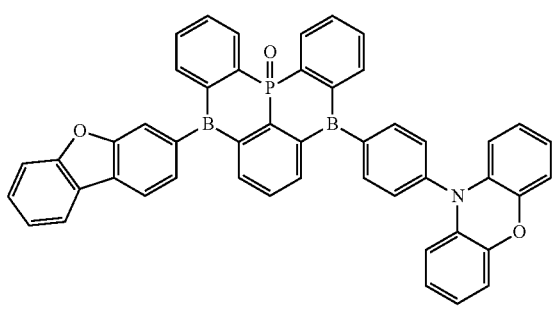

M6

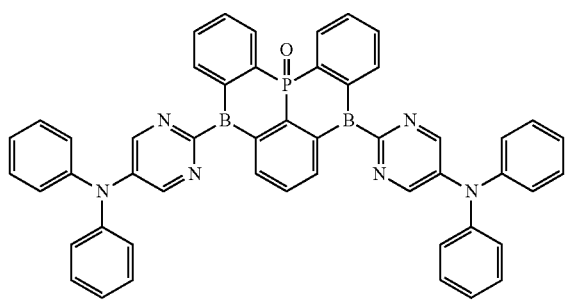

M12

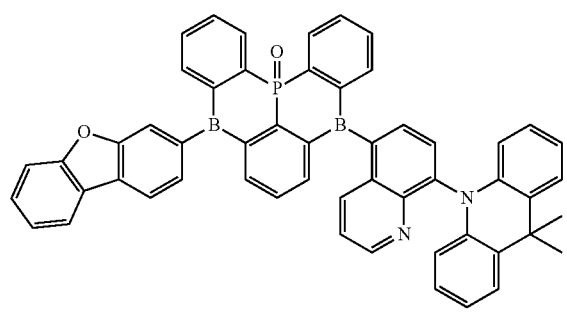

M29

In the present disclosure, an energy level difference, $\Delta E_{st}$, between a lowest singlet energy level, S1, of the compound and a lowest triplet energy level, T1, of the compound satisfies an equation $\Delta E_{st}=E_{S1}-E_{T1} \leq 0.25$ eV. Theoretical calculation results of TADF materials indicate that TADF properties are possible only if $\Delta E_{st}$ is not greater than 0.25.

The boron-heterocyclic compound of the present disclosure has TADF properties, and is suitable for use as a host material or a guest material of a light-emitting layer of OLEDs.

In another aspect, the present disclosure provides manufacturing methods of the boron-heterocyclic compounds M1, M6, M12, and M29, as described in Example 1 to Example 4.

M1

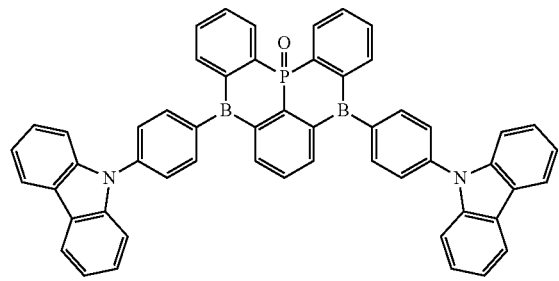

In the reactions of the following examples, the involved abbreviations and their meanings are introduced as follows:

THF: tetrahydrofuran

Tol or TOL: toluene

Ar$_2$: argon

RT: room temperature

Pressure Tube: airproof vessel or sealed tube

Example 1

Synthesis of Compound M1
Synthesis of Compound C

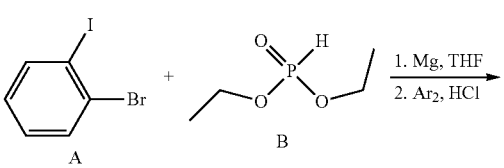

-continued

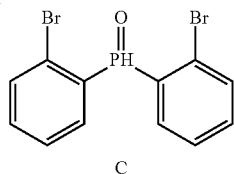

C

Under nitrogen protection, a mixture of 9.34 g (33 mmol) of compound A and 100 ml of anhydrous THF was slowly added dropwise to a 250 ml three-necked flask containing dry magnesium filings and a catalytic amount of iodine. After the dropwise addition was finished, the mixture was refluxed for 3 h, then cooled and filtered to obtain a Grignard reagent of compound A, which was then stored in a 100 ml single-necked flask filled with $Ar_2$. 1.38 g (10 mmol) of compound B was slowly added dropwise thereto, the mixture was aged at 0° C. for 10 min, stirred at room temperature for 2 h, and then cooled to 0° C. again. 25 mL of 0.1M HCl was added dropwise, and sufficiently stirred for 5 min. The upper organic phase decanted from a separator was stored. Then 20 mL of 1M HCl was added to the lower phase again, and extracted with $CH_2Cl_2$ (30 mL) twice. The organic phase was collected, filtered, dried, and rotary evaporated to remove the solvent. The obtained crude product was separated with silica gel column chromatography, using $MeOH/CH_2Cl_2$ as eluent, and then recrystallized in hot ethyl acetate (EtOAc) to obtain product C.

Characteristic data of compound C:
MALDI-TOF: 359.87.
$^1$H NMR (400 MHz, $CDCl_3$): δ 7.65 (s, 2H), 7.25 (s, 2H), 7.19 (s, 2H), 7.14 (s, 2H), 5.21 (s, 1H).
$^{13}$C NMR (100 MHz, $CDCl_3$): δ 133.39 (s), 132.17 (s), 130.73 (s), 126.66 (s), 119.15 (s).

Synthesis of Compound E

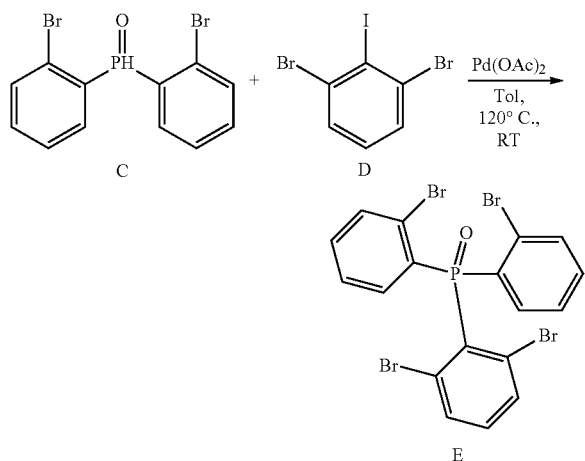

In a dry 100 ml Schlenk tube, 2.59 g (31.6 mmol) of NaOAc, 35 mg (0.14 mmol) of $Pd(OAc)_2$, Tol (65 mL), 10.44 g (29 mmol) of compound C, and 10.49 g (29 mmol) of compound D were added, and 5.0 mL (29 mmol) of diphenylphosphine was added through a syringe. The mixture was heated and reacted at 120° C. under reflux for 96 h. At room temperature, the mixture was diluted with water (50 mL), and extracted with $CHCl_3$. The organic phase was collected, n, filtered, dried, and rotary evaporated to remove the solvent. The obtained crude product was separated with silica gel column chromatography (1:2 EtOAc/hexane) to obtain compound E.

Characteristic Data of Compound E:
MALDI-TOF: 593.72.
$^1$H NMR (400 MHz, $CDCl_3$): δ 7.85 (s, 2H), 7.79 (s, 2H), 7.67 (s, 2H), 7.44 (d, J=4.0 Hz, 4H), 7.20 (s, 1H).
$^{13}$C NMR (100 MHz, $CDCl_3$): δ 157.43 (s), 150.43 (s), 133.33 (d, J=7.3 Hz), 132.18 (s), 130.97 (s), 130.68 (s), 127.81 (s), 123.60 (s), 120.04 (s).

Synthesis of Compound F

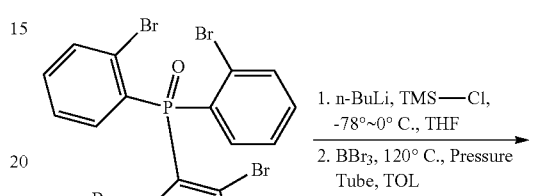

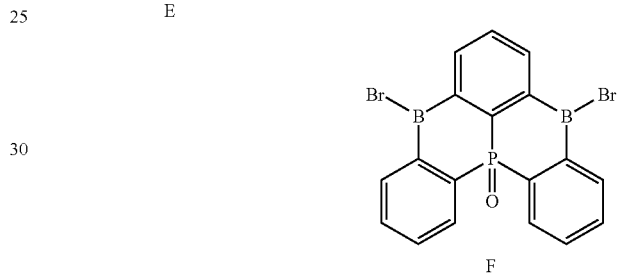

In a 250 ml three-necked flask, 11.88 g (20 mmol) of substrate E was dissolved with THF (80 mL), and nitrogen replacement was performed three times. The temperature was lowered to −78° C. After the temperature was reached, the temperature was controlled below −65° C., and 40 mL (100 mmol) of n-BuLi was slowly added dropwise, and stirred for 30 min after the dropwise addition was finished. Then, 8.72 g (80 mmol) of TMS-Cl was slowly added dropwise, then the temperature was raised to 0° C., and the mixture reacted for 4 hours. The reaction was then quenched with ice water, and extraction was performed with DCM (80 mL) twice. The organic phase was collected for rotary evaporation to obtain an oily product, which was crystallized with toluene/ethanol to obtain a solid. In a 200 mL airproof vessel, 11.34 g (20 mmol) of the solid, an anhydrous toluene solution (70 mL), and 10 g (40 mmol) of boron tribromide were added sequentially, and stirred at 120° C. for 12 h. Then the reaction was quenched with $H_2O$ (100 mL). The reaction solution was extracted with dichloromethane (DCM) (100 mL) three times, and the organic phase was collected, dried and filtered, and the solvent was removed by rotary evaporation. A solid F was obtained by crystallization with DCM/EtOH.

Characteristic Data of Compound F:
MALDI-TOF: 455.91
$^1$H NMR (400 MHz, $CDCl_3$): δ 7.95 (s, 4H), 7.78 (s, 2H), 7.57 (s, 3H), 7.51 (s, 2H).
$^{13}$C NMR (100 MHz, $CDCl_3$): δ 163.01 (s), 134.67 (s), 131.15 (dd, J=16.4, 14.6 Hz), 127.68 (s), 106.01 (s), 83.45 (s).

Synthesis of Compound M1

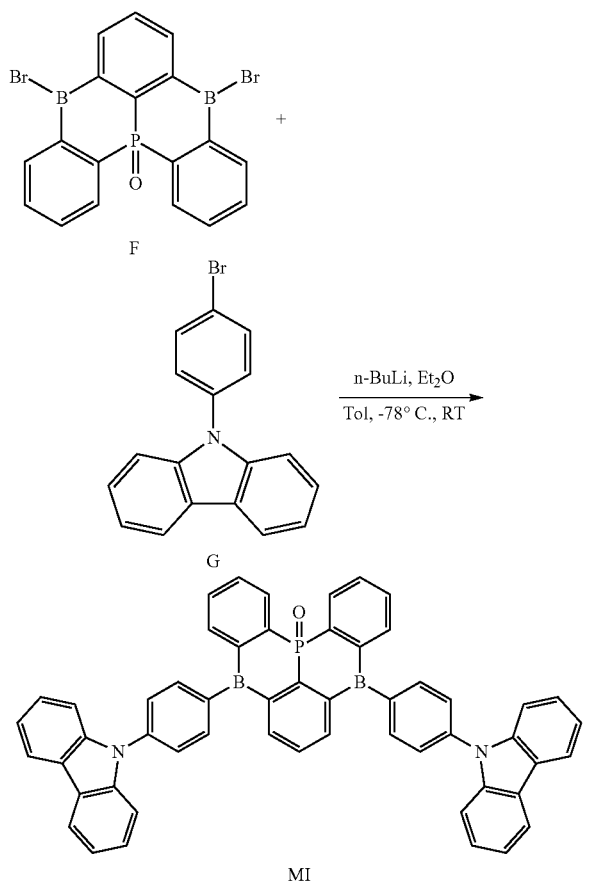

6.44 g (20 mmol) of compound G was added in a reaction flask and dissolved with ether (50 mL), and nitrogen replacement was performed three times. The temperature was lowered to −78° C. After the temperature was reached, the temperature was controlled below −65° C., and 8.45 mL (2.5M, 22 mmol) of n-BuLi was slowly added dropwise, and stirred for 30 min after the dropwise addition was finished. Then, 4.55 g (10 mmol) of monomer F dissolved in 60 mL of toluene was slowly added dropwise to the reaction solution, the temperature rose naturally to room temperature, and then the mixture reacted for 6 hours. The reaction was then quenched with ice water (100 mL), and extraction was performed with DCM (80 mL) twice and with saturated saline once. The organic phase was collected for rotary evaporation to obtain a white solid. The white solid was purified by column chromatography (mobile phase: n-hexane:dichloromethane=10:1) to obtain a solid M1.

Characteristic Data of Compound M1:

MALDI-TOF: 780.27

$^1$H NMR (400 MHz, CDCl$_3$): δ 8.55 (s, 2H), 8.19 (s, 2H), 7.95 (s, 4H), 7.89 (s, 4H), 7.78 (s, 2H), 7.73 (s, 4H), 7.57 (s, 4H), 7.52 (d, J=4.0 Hz, 4H), 7.40 (s, 2H), 7.25-7.15 (m, 5H), 7.11 (s, 2H).

$^{13}$C NMR (100 MHz, CDCl$_3$): δ 179.73 (s), 149.09 (s), 136.04 (s), 135.38 (s), 134.77 (d, J=10.6 Hz), 132.53 (s), 131.90 (s), 131.48 (d, J=8.0 Hz), 130.24 (s), 127.72 (s), 125.67 (s), 121.91 (s), 121.15 (d, J=2.7 Hz), 114.95 (s), 84.34 (s), 79.60 (s).

Example 2

In this example, compound F was synthesized in the same method as in example 1.

Synthesis of Compound M6

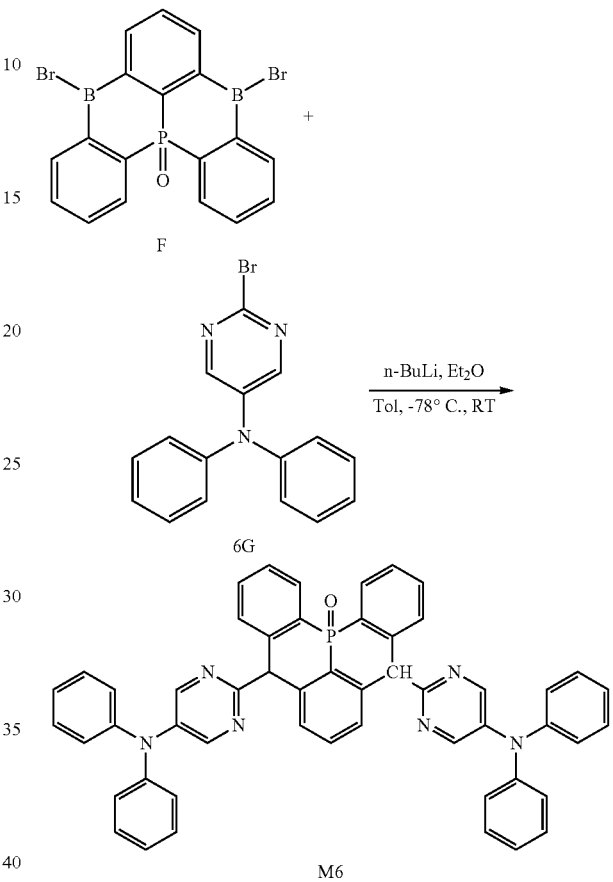

6.52 g (20 mmol) of compound 6G was added in a reaction flask and dissolved with ether (50 mL), and nitrogen replacement was performed three times. The temperature was lowered to −78° C. After the temperature was reached, the temperature was controlled below −65° C., and 8.45 mL (2.5M, 22 mmol) of n-BuLi was slowly added dropwise, and stirred for 30 min after the dropwise addition was finished. Then, 4.55 g (10 mmol) of monomer F dissolved in 60 mL of toluene was slowly added dropwise to the reaction solution, then the temperature rose naturally to room temperature, and the mixture reacted for 6 hours. The reaction was then quenched with ice water (100 mL), and extraction was performed with DCM (80 mL) twice and finally with saturated saline once. The organic phase was collected for rotary evaporation to obtain a white solid. The white solid was purified by column chromatography (mobile phase: n-hexane:dichloromethane=10:1) to obtain a solid M6.

Characteristic data of compound M6:

MALDI-TOF: 788.28.

$^1$H NMR (400 MHz, CDCl$_3$): δ 8.54 (s, 4H), 7.95 (s, 4H), 7.78 (s, 2H), 7.54 (d, J=24.0 Hz, 6H), 7.24 (s, 8H), 7.08 (s, 8H), 7.00 (s, 3H).

$^{13}$C NMR (100 MHz, CDCl$_3$): δ 179.73 (s), 146.93 (s), 145.02 (s), 139.80 (s), 137.35 (s), 137.02 (s), 134.84 (s), 134.62 (s), 129.27 (s), 128.68 (s), 127.52 (s), 126.78 (s), 124.67 (s), 122.99 (s), 102.32 (s).

Example 3

In this example, compound F was synthesized by the same method as in example 1.

Synthesis of Compound M12

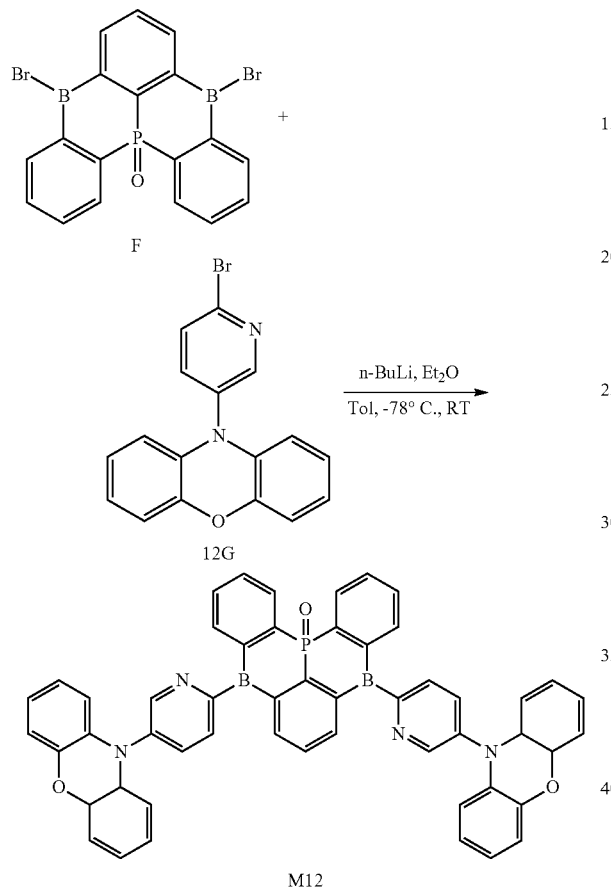

6.78 g (20 mmol) of compound 12G was added in a reaction flask and dissolved with ether (50 mL), and nitrogen replacement was performed three times. The temperature was lowered to −78° C. After the temperature was reached, the temperature was controlled below −65° C., and 8.45 mL (2.5M, 22 mmol) of n-BuLi was slowly added dropwise, and stirred for 30 min after the dropwise addition was finished. Then, 4.55 g (10 mmol) of monomer F dissolved in 60 mL of toluene was slowly added dropwise to the reaction solution, then the temperature rose naturally to room temperature, and the mixture reacted for 6 hours. The reaction was then quenched with ice water (100 mL), and extraction was performed with DCM (80 mL) twice and finally with saturated saline once. The organic phase was collected for rotary evaporation to obtain a white solid. The white solid was purified by column chromatography (mobile phase: n-hexane:dichloromethane=10:1) to obtain a solid M12.

Characteristic Data of Compound M12:

MALDI-TOF: 814.25.

$^1$H NMR (400 MHz, CDCl$_3$): δ 7.95 (s, 4H), 7.78 (s, 2H), 7.65 (s, 2H), 7.57 (s, 3H), 7.51 (s, 2H), 7.14 (s, 4H), 7.10 (s, 2H), 7.00 (d, J=12.0 Hz, 8H), 6.93 (s, 6H).

$^{13}$C NMR (100 MHz, CDCl$_3$): δ 179.73 (s), 146.79 (s), 145.07 (s), 140.39 (s), 138.55 (s), 137.03 (s), 136.23 (s), 135.43 (s), 134.63 (s), 134.28 (s), 132.27 (s), 131.85 (s), 128.35 (s), 123.59 (d, J=16.4 Hz), 119.00 (s), 116.41 (s), 101.91 (s), 100.20 (s).

Example 4

In this example, compound F was synthesized by the same method as in example 1.

Synthesis of Compound M29

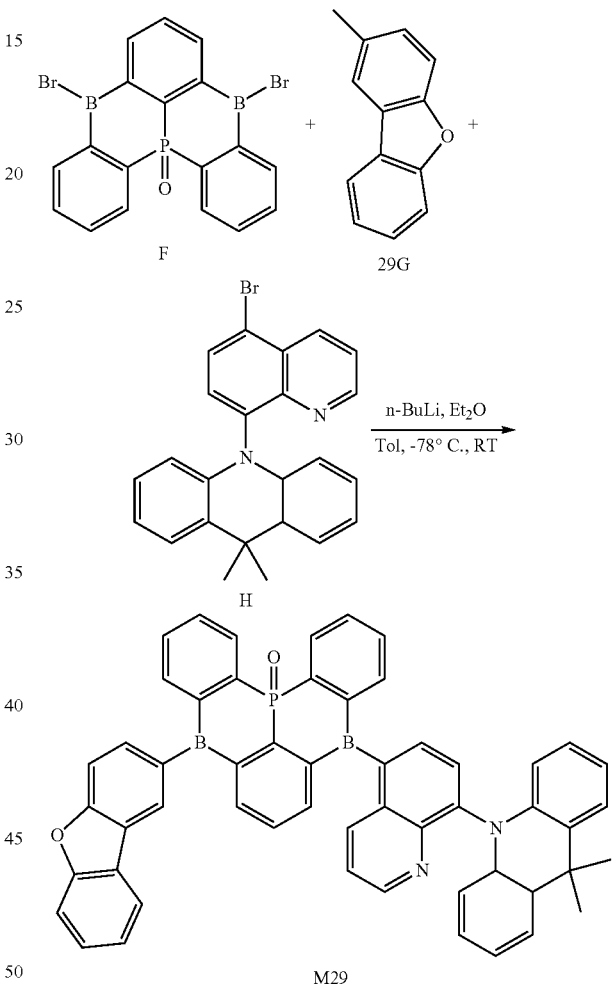

2.47 g (10 mmol) of compound 29G and 4.15 g (10 mmol) of compound H were added in a reaction flask and dissolved with ether (50 mL), and nitrogen replacement was performed three times. The temperature was lowered to −78° C. After the temperature was reached, the temperature was controlled below −65° C., and 8.45 mL (2.5M, 22 mmol) of n-BuLi was slowly added dropwise, and stirred for 30 min after the dropwise addition was finished. Then, 4.55 g (10 mmol) of monomer F dissolved in 60 mL of toluene was slowly added dropwise to the reaction solution, then the temperature rose naturally to room temperature, and the mixture reacted for 6 hours. The reaction was then quenched with ice water (100 mL), and extraction was performed with DCM (80 mL) twice and finally with saturated saline once. The organic phase was collected for rotary evaporation to obtain a white solid. The white solid was purified by column chromatography (mobile phase: n-hexane:dichloromethane=10:1) to obtain a solid M29.

Characteristic Data of Compound M29:
MALDI-TOF: 798.28.
$^1$H NMR (400 MHz, CDCl$_3$): δ 8.90 (s, 2H), 8.31 (s, 2H), 8.14 (s, 2H), 7.96 (d, J=12.0 Hz, 5H), 7.78 (s, 2H), 7.57 (s, 3H), 7.54-7.47 (m, 4H), 7.38 (d, J=12.0 Hz, 2H), 7.31 (s, 2H), 7.23-7.13 (m, 6H), 6.94 (s, 2H), 1.69 (s, 6H).
$^{13}$C NMR (100 MHz, CDCl$_3$): δ 179.73 (s), 156.61 (s), 155.19 (s), 147.42 (d, J=7.3 Hz), 145.29 (s), 141.02 (s), 140.18 (s), 139.00 (s), 138.44 (s), 136.94 (s), 136.12 (s), 135.67 (s), 135.10 (s), 134.71 (s), 132.90 (s), 132.45 (dd, J=16.5, 3.0 Hz), 131.56 (t, J=10.6 Hz), 131.00 (s), 129.03 (s), 128.37 (s), 127.77 (s), 127.31 (s), 123.57 (s), 122.83 (d, J=1.2 Hz), 121.98 (d, J=17.3 Hz), 121.20 (s), 119.98 (s), 119.24 (s), 112.56 (s), 112.06 (s), 84.34 (s), 79.60 (s), 76.90 (s), 70.34 (s), 35.71 (s), 29.68 (s).

The electroluminescent performances of the exemplary boron-heterocyclic compounds M1, M2, M3, M4, M6, M12, and M29 of the present disclosure were simulated by using Gaussian software.

Figure 2:
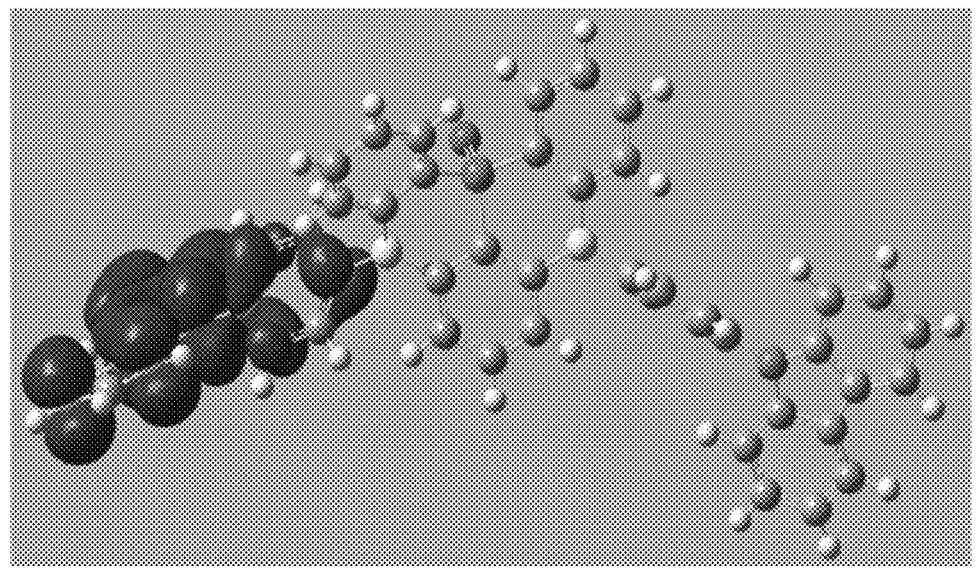
FIG. 2 is a HOMO distribution diagram of the boron-heterocyclic compound M1 of the present disclosure.
Figure 3:
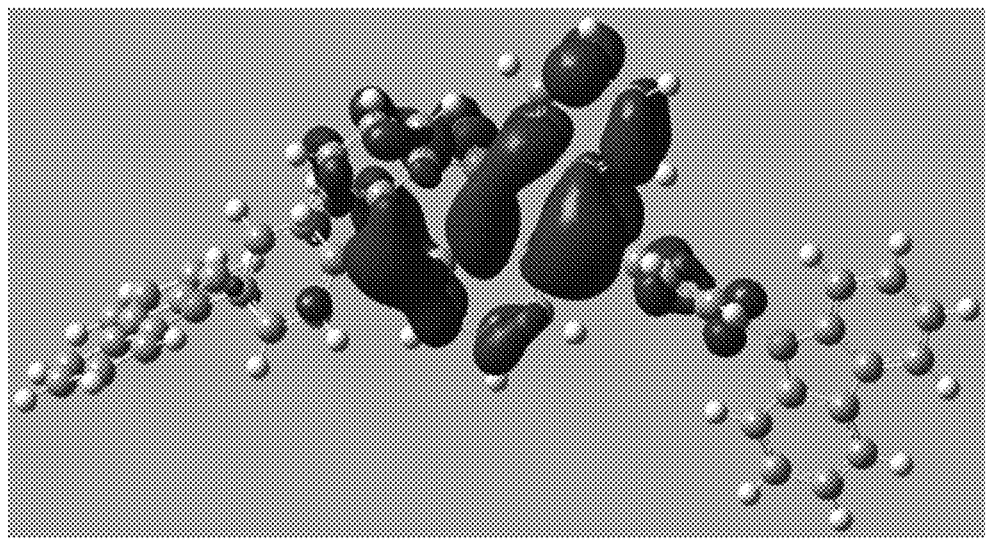
FIG. 3 is a LUMO distribution diagram of the boron-heterocyclic compound M1 of the present disclosure.

FIG. 2 and FIG. 3 are diagrams of HOMO and LUMO energy levels of the exemplary boron-heterocyclic compound M1 of the present disclosure. It can be clearly seen from FIG. 2 and FIG. 3 that the HOMO and LUMO of the compound molecule M1 are arranged on the donor unit and the acceptor unit, respectively, achieving separation between HOMO and LUMO, which is conducive to reducing intersystem energy difference LEST, thereby improving the reverse intersystem crossing ability.

HOMO energy level, LUMO energy level and other parameters of the boron-heterocyclic compounds M1, M2, M3, M4, M6, M12, and M29 were tested, and the obtained results are shown in Table 1.

TABLE 1

Parameters of four representative boron-heterocyclic compounds

| Compound | HOMO (ev) | LUMO (ev) | S$_1$ (ev) | T$_1$ (ev) | ΔE$_{ST}$ (ev) | τ (μS) |
|---|---|---|---|---|---|---|
| M1 | −5.37 | −2.55 | 2.81 | 2.78 | 0.03 | 10.13 |
| M2 | −5.37 | −2.53 | 2.84 | 2.79 | 0.05 | 9.92 |
| M3 | −4.89 | −2.33 | 2.56 | 2.45 | 0.11 | 5.16 |
| M4 | −4.61 | −2.39 | 2.22 | 2.18 | 0.04 | 6.32 |
| M6 | −5.23 | −2.41 | 2.49 | 2.40 | 0.09 | 1.48 |
| M12 | −4.98 | −2.27 | 2.41 | 2.35 | 0.06 | 4.86 |
| M29 | −5.17 | −2.48 | 2.61 | 2.53 | 0.08 | 3.97 |

It can be seen from Table 1, the boron-heterocyclic compound of the present disclosure has a significantly smaller energy level difference between HOMO and LUMO, thereby facilitating the electron transition.

In another aspect, the present disclosure provides a display panel. The display panel includes an organic light-emitting device. The organic light-emitting device includes an anode, a cathode, and a light-emitting layer disposed between the anode and the cathode. A light-emitting host material or guest material of the light-emitting layer is one or more boron-heterocyclic compounds of the present disclosure.

In an embodiment of the display panel of the present disclosure, the organic light-emitting device further includes one or more layers of a hole injection layer, a hole transport layer, an electron blocking layer, a hole blocking layer, an electron transport layer, or an electron injection layer.

Figure 4:
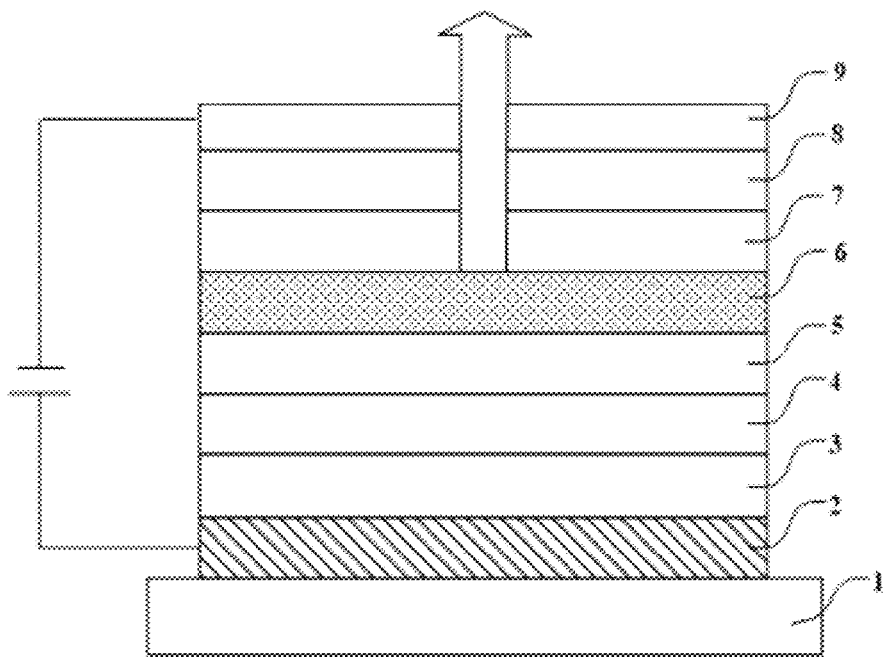
FIG. 4 is a structural schematic diagram of an OLED according to an embodiment of the present disclosure.

In an embodiment of the display panel of the present disclosure, the organic light-emitting device (OLED) has a structure shown in FIG. 4.

In the display panel provided by the present disclosure, the anode of the organic light-emitting device can be made of a material selected from the group consisting of metals such as copper, gold, silver, iron, chromium, nickel, manganese, palladium, platinum, and alloys thereof; metal oxides such as indium oxide, zinc oxide, indium tin oxide (ITO), indium zinc oxide (IZO), or the like; conductive polymers such as polyaniline, polypyrrole, poly(3-methylthiophene), and the like; and other materials and combinations thereof, which are conductive to hole injection, including materials known to be suitable for using as the anode.

In the display panel provided by the present disclosure, the cathode of the organic light-emitting device can be made of a material selected from the group consisting of metals such as aluminum, magnesium, silver, indium, tin, titanium, and alloys thereof; multiple-layered metal materials, such as LiF/Al, LiO$_2$/Al, BaF$_2$/Al, and the like; and other materials and combinations thereof that facilitate electron injection, including materials known to be suitable for using as the cathode.

In the display panel according to the present disclosure, the organic light-emitting device can be manufactured by the following steps: forming an anode on a transparent or opaque smooth substrate; forming an organic thin layer on the anode; and forming a cathode on the organic thin layer. The organic thin layer can be formed with a known method such as vapor deposition, sputtering, spin coating, dipping, ion plating, and the like.

The following Example 5 and Example 6 provide exemplary device examples for illustrating practical applications of the boron-heterocyclic compounds of the present disclosure in the light-emitting device.

Example 5

The present example provides a method for manufacturing an organic light-emitting device, which is schematically shown in FIG. 2. The organic light-emitting device includes a substrate 1, an anode 2 (ITO), a hole injection layer 3, a first hole transport layer 4, a second hole transport layer 5, a light-emitting layer 6, an electron transport layer 7, an electron injection layer 8, and a cathode 9 (aluminum electrode).

The organic light-emitting device was specifically manufactured with the following steps:

1) a ITO film glass substrate 1 having a thickness of 100 nm was cut into a size of 50 mm×50 mm×0.7 mm, ultrasonically cleaned respectively in acetone, isopropyl alcohol and deionized water for 30 minutes, and then cleaned under UV ozone for 30 minutes; the obtained glass substrate with an indium tin oxide (ITO) anode 2 was mounted on a vacuum deposition apparatus;

2) the material PSS was deposited on the ITO anode layer 2 by vacuum evaporation to form the hole injection layer 3 having a thickness of 10 nm;

3) the material PEDOT was deposited on the hole injection layer 3 by vacuum evaporation to form the first hole transport layer 4 having a thickness of 40 nm;

4) the hole transport material TAPC was deposited on the first hole transport layer 4 by vacuum evaporation to form the second hole transport layer 5 having a thickness of 20 nm;

5) a light-emitting layer 6 was deposited on the second hole transport layer 5 by vacuum evaporation, in which 3,3'-bis(N-carbazolyl)-1,1'-biphenyl (mCBP) was used as the host material of the light-emitting layer, and the boron-heterocyclic compound M1 of the present disclosure was used as the dopant of the light-emitting layer in a doping ratio of 3% (mass ratio), and the light-emitting layer has a thickness of 35 nm;

6) the electron transmission material TmPyPb was vacuum evaporated on the light-emitting layer 6 to form the electron transport layer 7 having a thickness of 50 nm; and 7) a layer of LiF having a thickness of 2.5 nm was evaporated on the electron transport layer 7 and used as the electron injection layer; and further, an Al electrode having a thickness of 100 nm was vacuum evaporated on the electron injection layer and used as the cathode 9, so as to obtain an organic light-emitting device D1.

Example 6

The boron-heterocyclic compounds M1, M2, M3, M4, M6, M12, and M29 of the present disclosure, for example, were used as fluorescent dopants, to design the following light-emitting devices D1, D2, D3, D4, D5, D6, and D7.

Based on the structure of the light-emitting device D1, the fluorescent dopant boron-heterocyclic compound M1 in the light-emitting device D1 was replaced with the boron-heterocyclic compounds M2, M3, M4, M6, M12, and M29 of the present disclosure, respectively, to design the light-emitting devices D2, D3, D4, D5, D6, and D7.

The devices 2 to 7 (D2 to D7) were manufactured by the same method as the device D1. In addition, a comparative device 1 was manufactured with a comparative compound DMQA. The manufactured devices merely differed from each other in the selected dopant, and the materials of the other functional layers were the same. A DC voltage was applied to the manufactured organic light-emitting device, and the luminous performances of the light-emitting devices were measured and summarized in Table 2.

DMQA has the following structure:

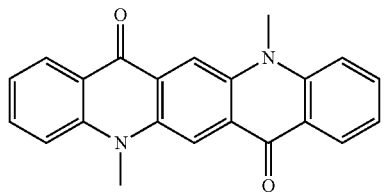 [SMILES: Cn1c2ccccc2c(=O)c2cc3c(cc21)c(=O)c1ccccc1n3C]

It can be seen from Table 2 that the OLED devices using the boron-heterocyclic compounds according to the present disclosure have higher external quantum efficiency (EQE), which can reach a maximum of 21.35. Compared with the comparative example, the structure of the boron-heterocyclic compounds according to the present disclosure have TADF properties, and the triplet exciton, which is blocked in molecular transition of the conventional fluorescent material, can be used to emit light, thereby improving the efficiency of the device. Moreover, the boron-heterocyclic compound according to the present disclosure itself has bipolarity, and thus can greatly improve the transport ability of the two kinds of carriers and improve the balance of the carriers when it is used as a material of the light-emitting layer. Therefore, the external quantum efficiency is improved and can reach a maximum of 21.35, which is much higher than that of the comparative device 1.

In another aspect, the present disclosure also provides a display apparatus including the above-mentioned organic light-emitting display panel.

Figure 5:
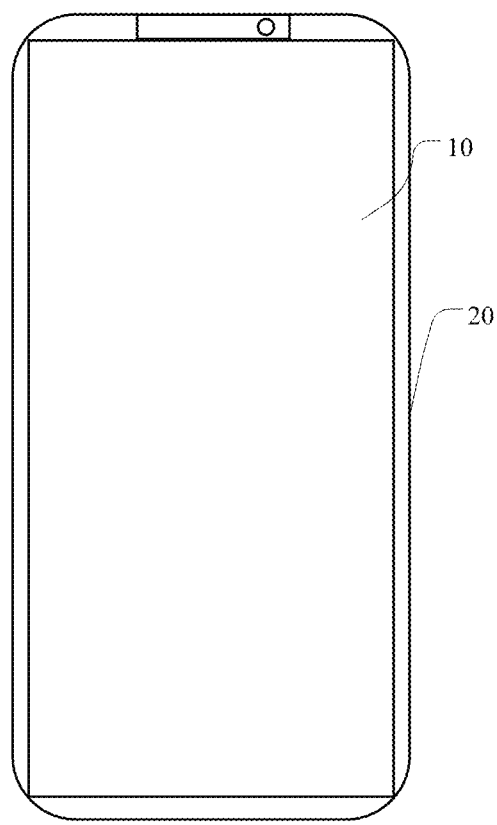
FIG. 5 is a schematic diagram of a display apparatus according to an embodiment of the present disclosure.

In the present disclosure, the organic light-emitting device may be an OLED used in a display apparatus. The display apparatus can be display screen of various smart devices, such a mobile phone display screen, a computer display screen, a television display screen, a smart watch display screen, a display panel of smart car, a display screen of a Virtual Reality (VR) or Augmented Reality (AR) helmet, etc. FIG. 5 is a schematic diagram of a display apparatus according to an embodiment of the present disclosure, in which 10 denotes a mobile phone display panel, and 20 denotes a display apparatus.

The present disclosure is illustrated with the preferred embodiments described above, but the present disclosure is not limited thereto. Various changes and modifications may be made without departing from the scope of the present disclosure. The protection scope of the present disclosure is defined by the appended claims.

TABLE 2

Measurement results of luminous performances of light-emitting devices

| Light-emitting devices | Compound | Doped or not | $V_{turn-on}$ [V] | CE (max) (cd/A) | PE (max) (lm/W) | $EQE_{(max)}$ (%) | CIE (x, y) |
|---|---|---|---|---|---|---|---|
| D1 | M1 | Yes | 3.0 | 21.80 | 22.82 | 13.40 | (0.16, 0.18) |
| D2 | M2 | Yes | 3.0 | 20.75 | 21.72 | 12.98 | (0.16, 0.19) |
| D3 | M3 | Yes | 3.0 | 41.5 | 43.44 | 13.90 | (0.23, 0.54) |
| D4 | M4 | Yes | 3.0 | 18.93 | 19.81 | 15.64 | (0.48, 0.51) |
| D5 | M6 | Yes | 3.0 | 34.17 | 35.76 | 21.35 | (0.23, 0.54) |
| D6 | M12 | Yes | 3.0 | 29.89 | 31.29 | 16.59 | (0.25, 0.71) |
| D7 | M29 | Yes | 3.0 | 26.62 | 27.86 | 19.83 | (0.18, 0.74) |
| Comparative light-emitting device 1 | DMQA | Yes | 4.0 | 10.15 | 10.62 | 2.77 | (0.38, 0.58) |

What is claimed is:

1. A compound, having a structure according to Chemical Formula (1):

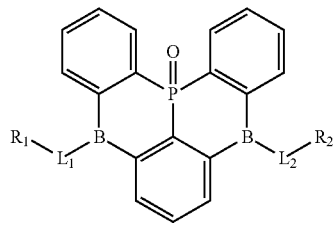

Chemical Formula (1)

wherein
L₁ and L₂ are each independently selected from the group consisting of a single bond, C6-C30 aryl, C6-C30 fused aryl, C4-C30 heteroaryl, and C4-C30 fused heteroaryl;
R₁ and R₂ are each independently selected from the group consisting of C1-C20 alkyl, C3-C20 cycloalkyl, C1-C20 alkoxy, a substituted or unsubstituted phenyl, a substituted or unsubstituted biphenyl, a substituted or unsubstituted naphthyl, a substituted or unsubstituted anthracyl, a substituted or unsubstituted phenanthryl, a substituted or unsubstituted acenaphthylenyl, a substituted or unsubstituted pyrenyl, a substituted or unsubstituted perylenyl, a substituted or unsubstituted fluorenyl, a substituted or unsubstituted spirodifluorenyl, a substituted or unsubstituted chrysenyl, a substituted or unsubstituted benzophenanthryl, a substituted or unsubstituted benzoanthracyl, a substituted or unsubstituted fluoranthenyl, a substituted or unsubstituted picenyl, a substituted or unsubstituted furyl, a substituted or unsubstituted benzofuryl, a substituted or unsubstituted dibenzofuryl, a substituted or unsubstituted thienyl, a substituted or unsubstituted benzothienyl, a substituted or unsubstituted dibenzothienyl, a substituted or unsubstituted phenoxazinyl, a substituted or unsubstituted phenazinyl, a substituted or unsubstituted phenothiazinyl, a substituted or unsubstituted thianthrenyl, carbazolyl, acridinyl, and diphenylamino.

2. The compound according to claim 1, wherein L₁ and L₂ are each independently selected from the group consisting of phenylene, naphthylene, anthrylene, phenanthrylene, pyridylidene, furylidene, pyrimidinylidene, benzofurylidene, thienylene, benzothienylene, pyrrolylene, indolylidene, carbazolylene, oxazolylene, benzoxazolylene, thiazolylene, benzothiazolylene, imidazolylene, benzimidazolylene, indazolylene, quinolinylene, and isoquinolinylene.

3. The compound according to claim 1, wherein L₁ and L₂ are identical.

4. The compound according to claim 1, wherein R₁ and R₂ are identical.

5. The compound according to claim 1, wherein R₁ and R₂ are each independently selected from the following formulas:

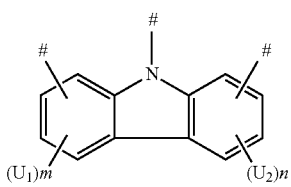

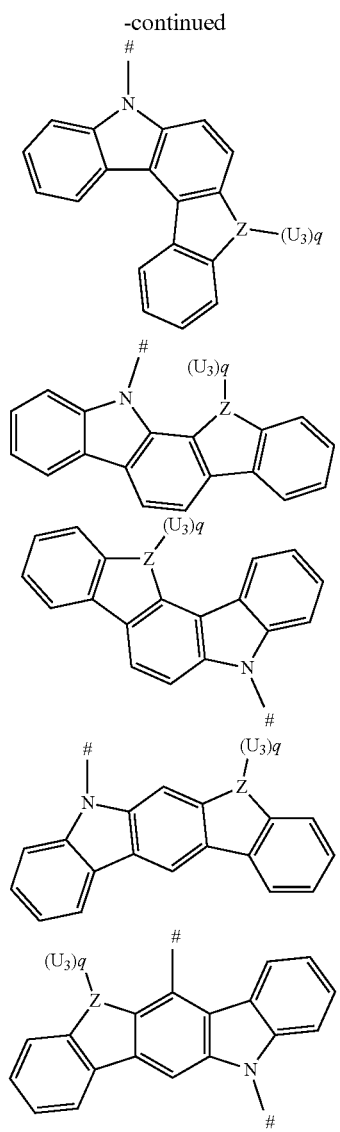

wherein
Z is selected from the group consisting of a carbon atom, a nitrogen atom, an oxygen atom, and a sulfur atom;
U₁, U₂ and U₃ are each independently selected from the group consisting of a hydrogen atom, C1-C6 alkyl, and C1-C6 alkoxy;
m, n and q are each an integer independently selected from 0, 1 and 2;
when Z is an oxygen atom or a sulfur atom, q is 0; and
# represents a bonding position.

6. The compound according to claim 5, wherein R₁ and R₂ are each independently selected from the following groups:

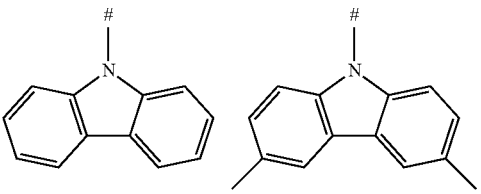

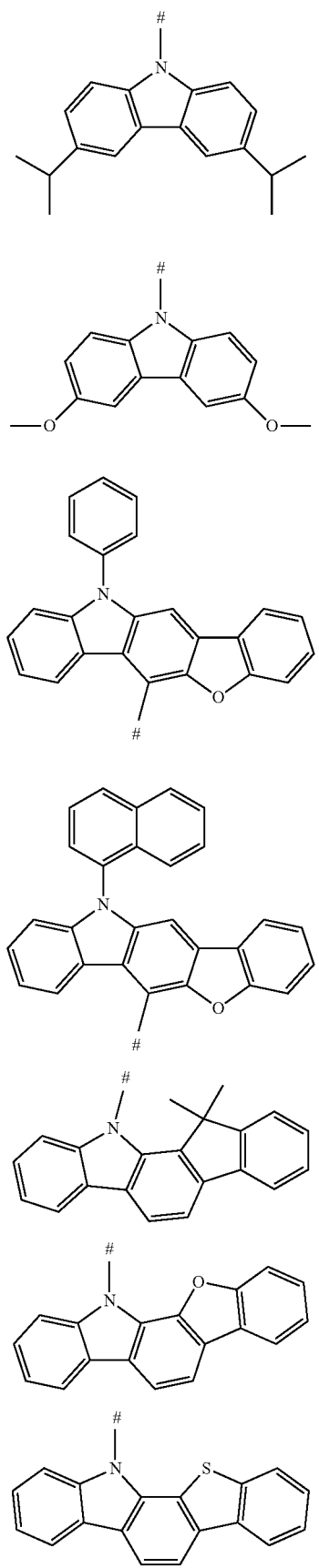
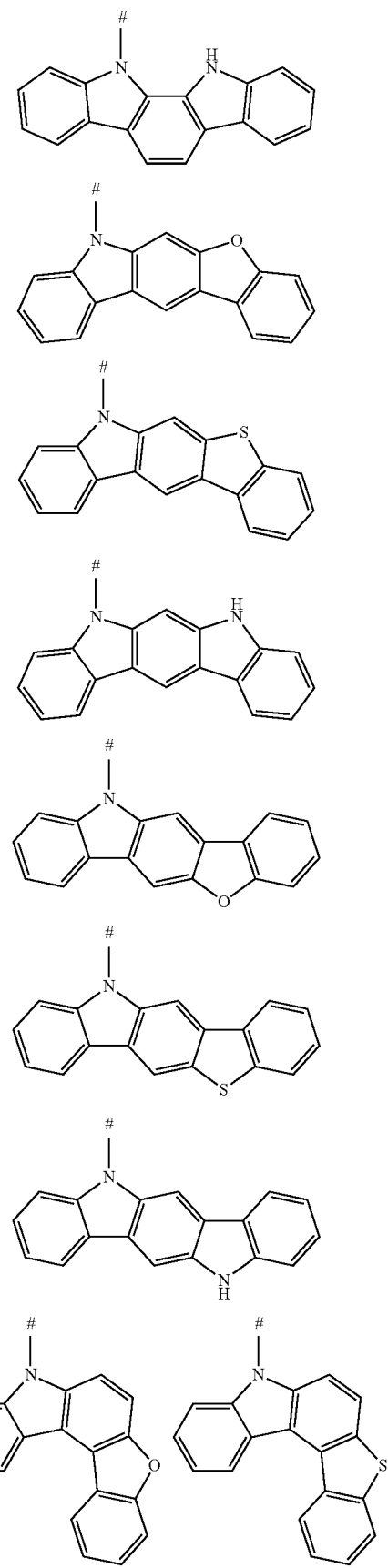

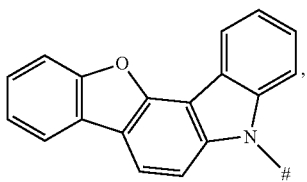

wherein # represents a bonding position.

7. The compound according to claim 1, wherein $R_1$ and $R_2$ are each independently selected from the following formulas:

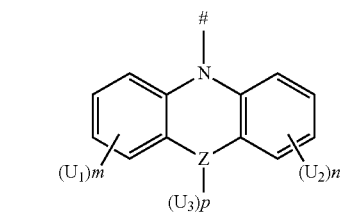

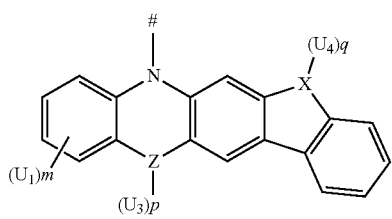

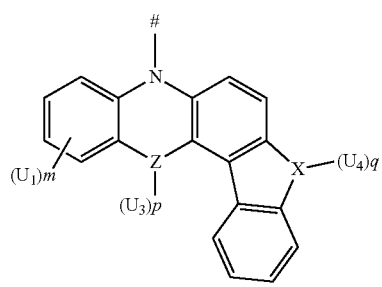

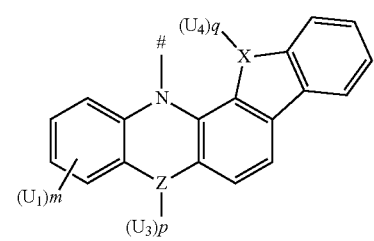

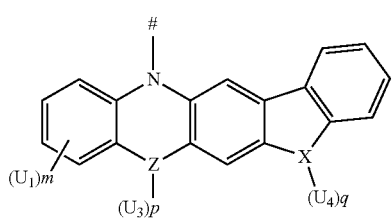

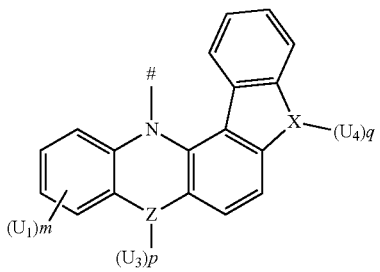

wherein

Z is selected from the group consisting of a carbon atom, a nitrogen atom, an oxygen atom, a sulfur atom, and a silicon atom;

X is selected from the group consisting of a carbon atom, a nitrogen atom, an oxygen atom, and a sulfur atom;

$U_1$, $U_2$, $U_3$ and $U_4$ are each independently selected from the group consisting of a hydrogen atom, C1-C6 alkyl, C3-C6 cycloalkyl, C1-C6 alkoxy, and C6-C12 aryl;

m, n, p and q are each an integer independently selected from 0, 1 and 2;

when Z is an oxygen atom or a sulfur atom, p is 0, and when X is an oxygen atom or a sulfur atom, q is 0; and # represents a bonding position.

8. The compound according to claim 7, wherein $R_1$ and $R_2$ are each independently selected from the following formulas:

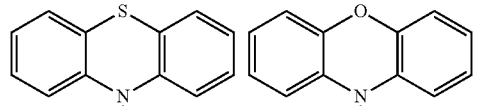

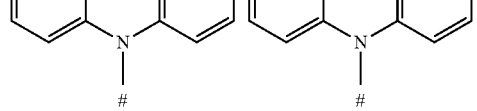

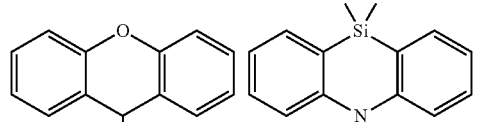

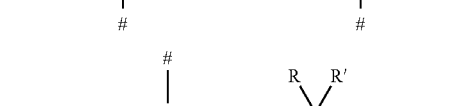

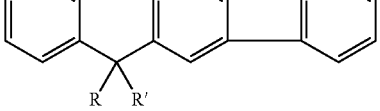

-continued

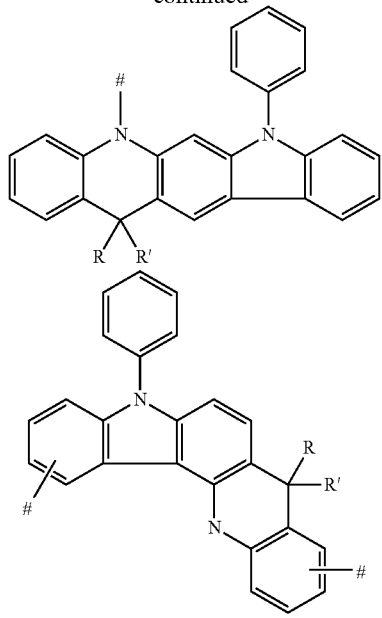

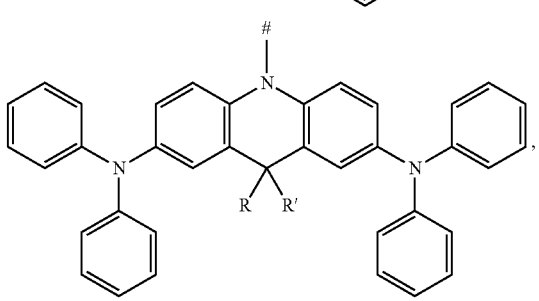

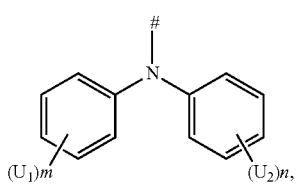

wherein
R and R' are each independently selected from the group consisting of a hydrogen atom, C1-C3 alkyl, and phenyl; and
# represents a bonding position.

9. The compound according to claim 1, wherein $R_1$ and $R_2$ are each independently selected from the following formulas:

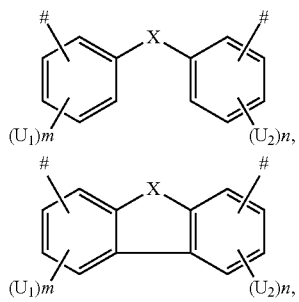

wherein
$U_1$ and $U_2$ are each independently selected from the group consisting of a hydrogen atom, C1-C6 alkyl, and C1-C6 alkoxy;
m and n are each an integer independently selected from 0, 1, and 2; and
# represents a bonding position.

10. The compound according to claim 9, wherein $R_1$ and $R_2$ are each independently selected from the following groups:

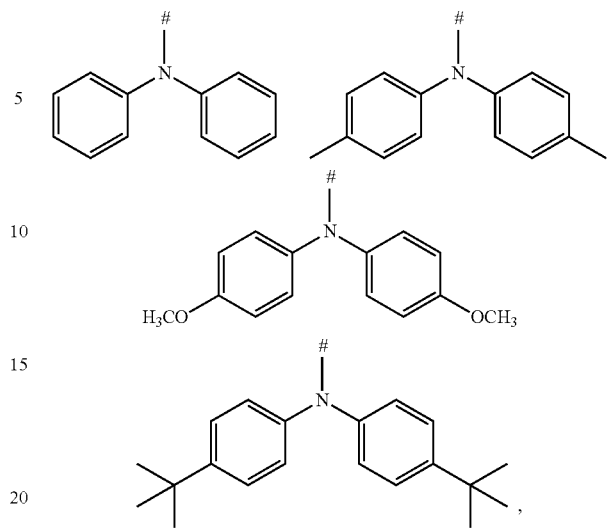

wherein # represents a bonding position.

11. The compound according to claim 1, wherein $R_1$ and $R_2$ are each independently selected from the following formulas:

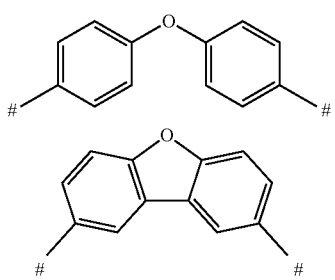

wherein
X is an oxygen atom or a sulfur atom;
$U_1$ and $U_2$ are each independently selected from the group consisting of a hydrogen atom, C1-C6 alkyl, C3-C6 cycloalkyl, and C1-C6 alkoxy;
m and n are each an integer independently selected from 0, 1, and 2; and
# represents a bonding position.

12. The compound according to claim 11, wherein $R_1$ and $R_2$ are each independently selected from the following groups:

-continued

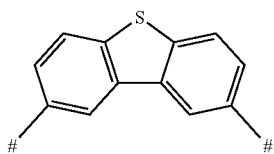

wherein # represents a bonding position.

13. The compound according to claim 1, wherein L₁ and L₂ are each independently selected from the following groups:

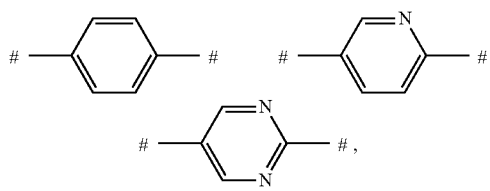

R₁ and R₂ are each independently selected from the following formulas:

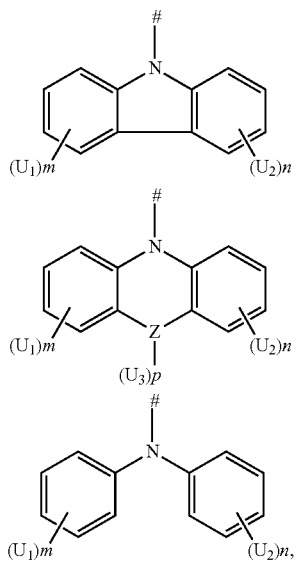

wherein
U₁, U₂, and U₃ are each independently selected from the group consisting of C1-C3 alkyl, and C6-C12 aryl;
m and n are 0, and p is an integer selected from 0, 1, and 2;
Z is selected from the group consisting of a carbon atom, a nitrogen atom, an oxygen atom, and a sulfur atom;
when Z is an oxygen atom or a sulfur atom, p is 0; and
# represents a position bonding to the Chemical Formula 1.

14. The compound according to claim 1, wherein L₁ and L₂ are each independently selected from the following groups:

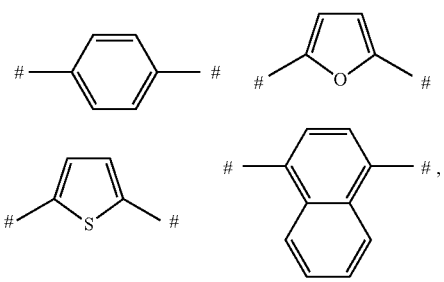

R₁ and R₂ are each independently selected from the following groups:

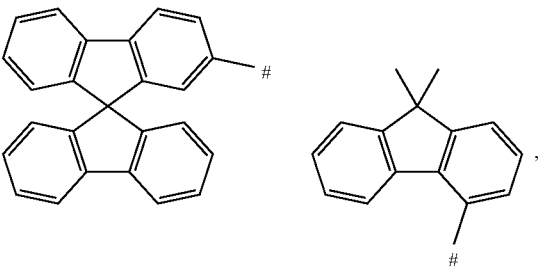

and
# represents a position bonding to the Chemical Formula 1.

15. The compound according to claim 1, wherein the compound is selected from the following compounds:

M1

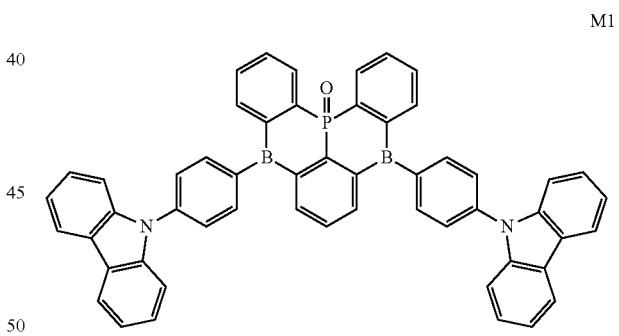

M2

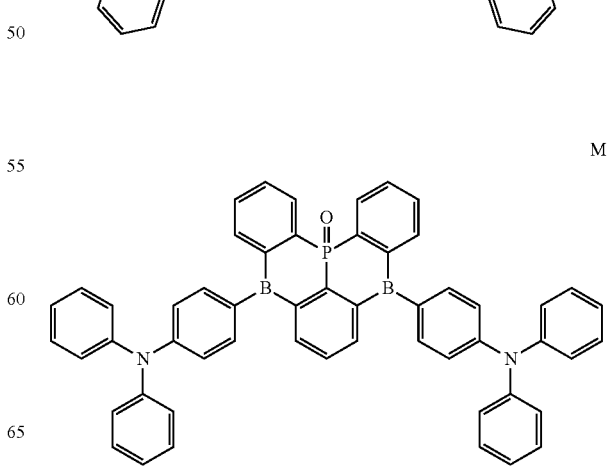

M3
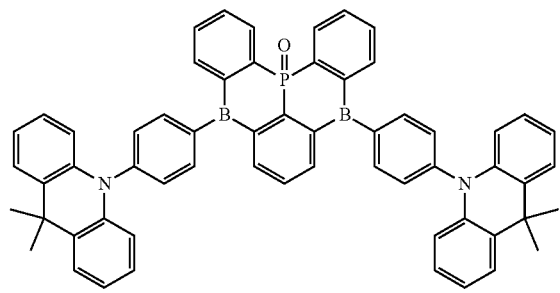
M4
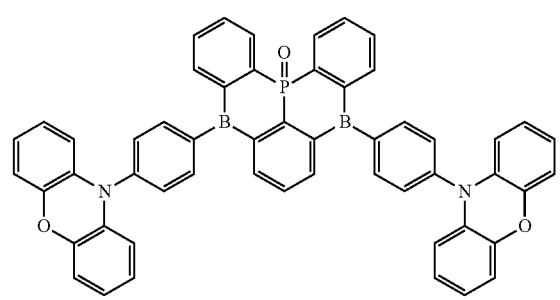
M5
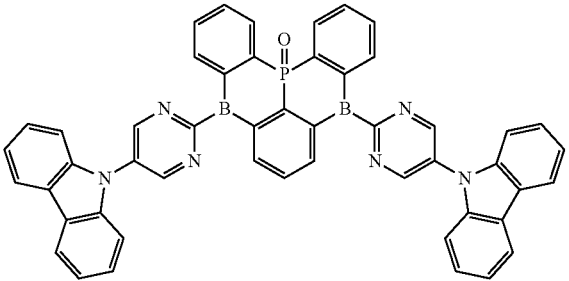
M6
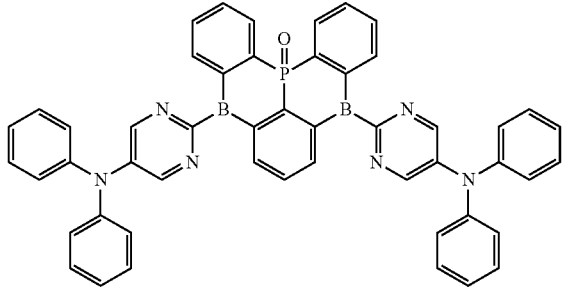
M7
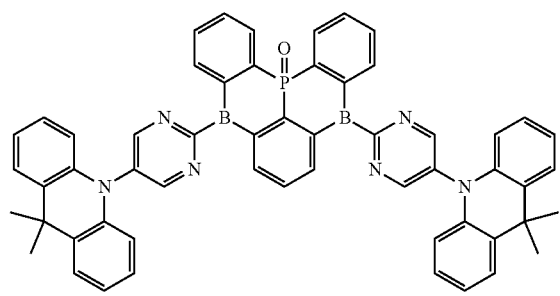
M8
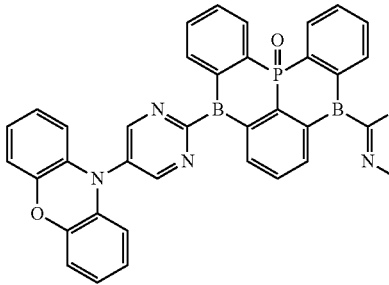
M9
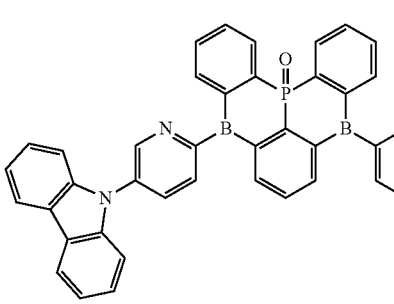
M10
M11
M12

M13
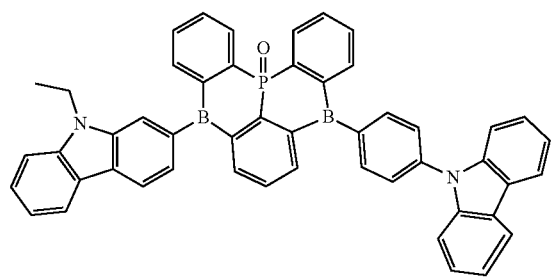
M14
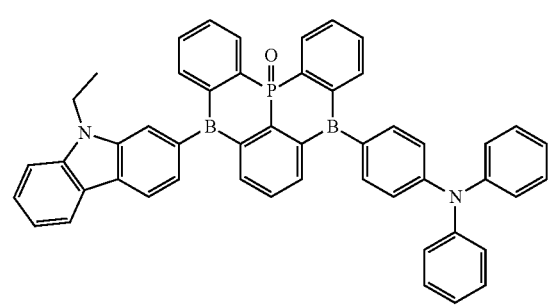
M15
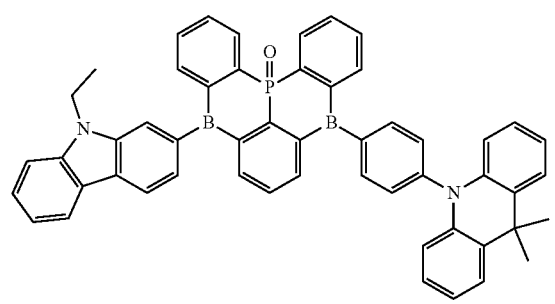
M16
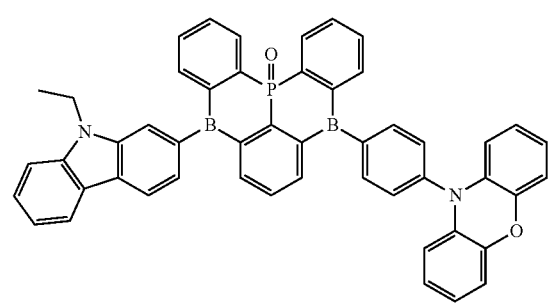
M17
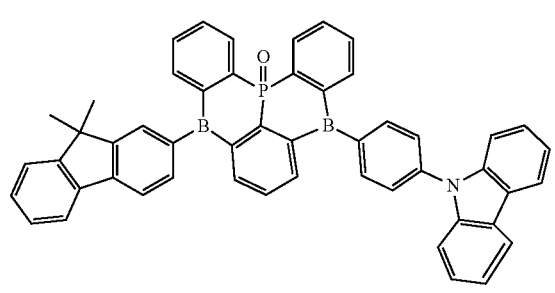
M18
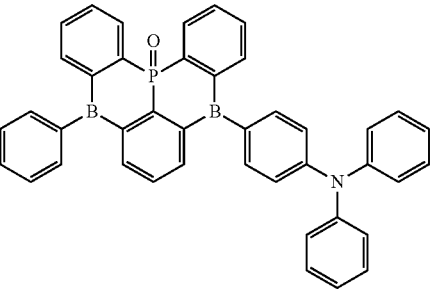
M19
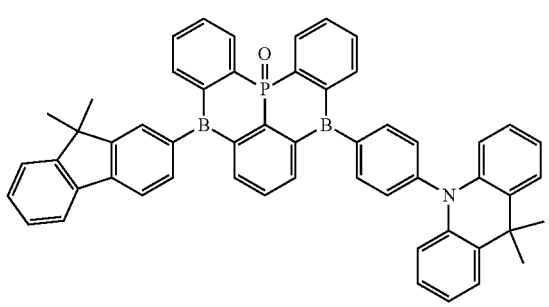
M20
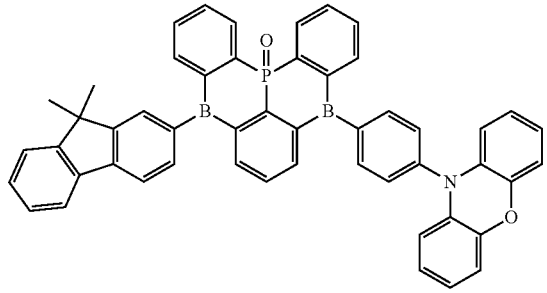
M21
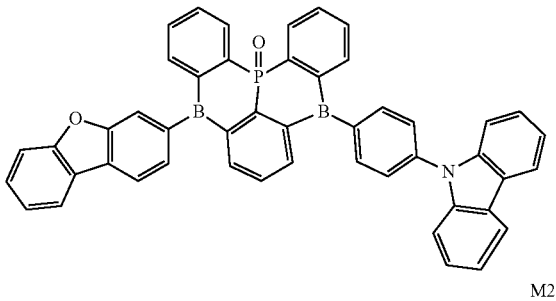
M22
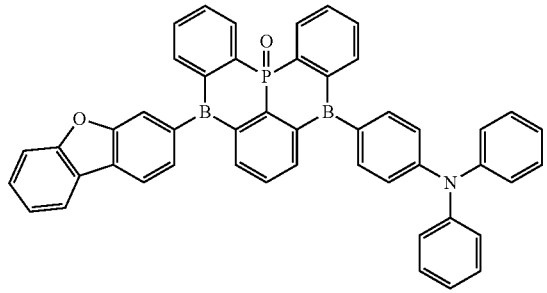

M23
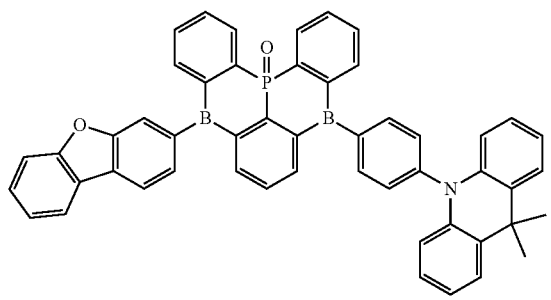

M24
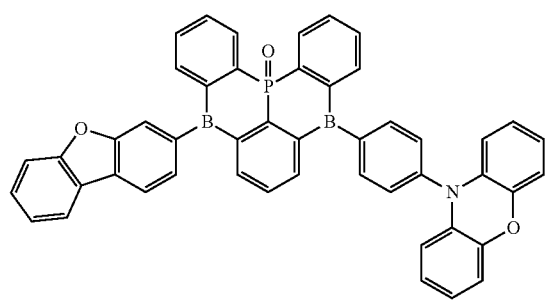

M25
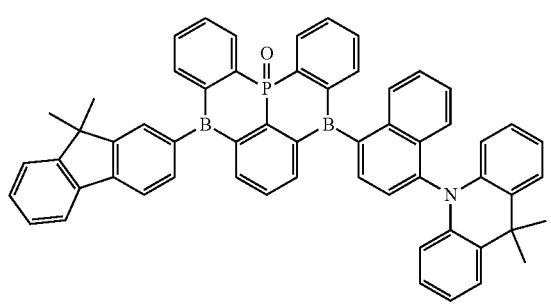

M26
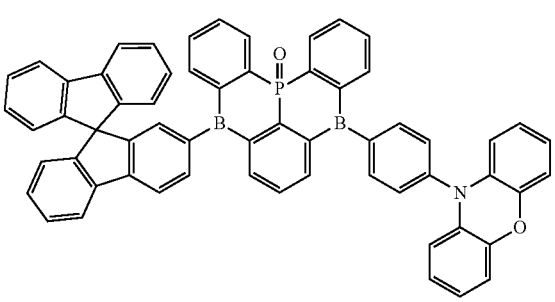

M27
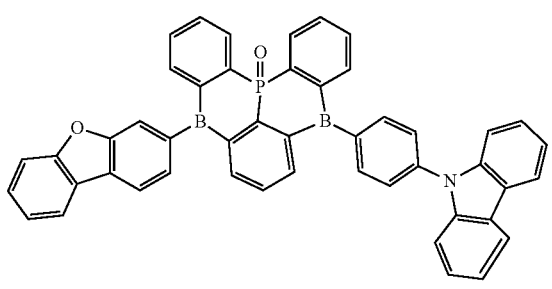

M28
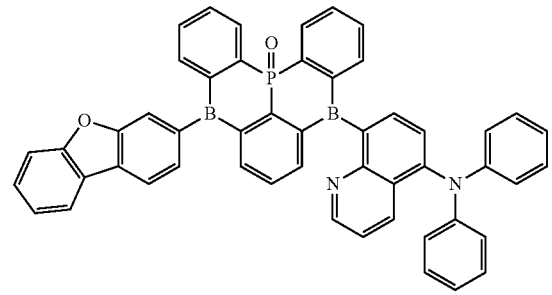

M29
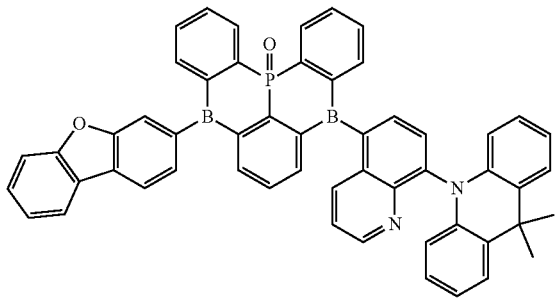

M30
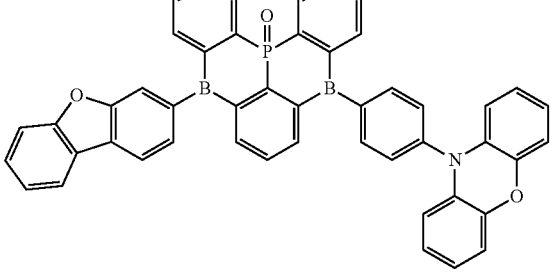

16. The compound according to claim 1, wherein an energy level difference, $\Delta E_{st}$, between a lowest singlet energy level, S1, of the compound and a lowest triplet energy level, T1, of the compound satisfies an equation $\Delta E_{st}=E_{S1}-E_{T1} \leq 0.25$ eV.

17. A display panel, comprising an organic light-emitting device, wherein the organic light-emitting device comprises an anode, a cathode, and a light-emitting layer disposed between the anode and the cathode, wherein a host material or a guest material of the light-emitting layer is one or more compounds according to claim 1.

18. The display panel according to claim 17, further comprising one or more layers of a hole injection layer, a hole transport layer, an electron blocking layer, a hole blocking layer, an electron transport layer or an electron injection layer.

19. A display apparatus, comprising the display panel according to claim 17.

20. A display apparatus, comprising the display panel according to claim 18.

* * * * *